United States Patent [19]
Holland et al.

[11] Patent Number: 5,367,669
[45] Date of Patent: Nov. 22, 1994

[54] FAULT TOLERANT HARD DISK ARRAY CONTROLLER

[75] Inventors: Alexander Holland; Peter G. Vavaroutsos, both of San Jose, Calif.

[73] Assignee: Eclipse Technologies, Inc., San Jose, Calif.

[21] Appl. No.: 35,410

[22] Filed: Mar. 23, 1993

[51] Int. Cl.$^5$ .............................................. G06F 11/00
[52] U.S. Cl. .................................... 395/575; 371/10.1
[58] Field of Search .............................. 395/575, 425; 364/243.2, 245.0; 371/10.1

[56] References Cited

U.S. PATENT DOCUMENTS

| | | | |
|---|---|---|---|
| 5,101,492 | 3/1992 | Schultz et al. | 395/575 |
| 5,148,432 | 9/1992 | Gordon et al. | 371/10.1 |
| 5,155,835 | 10/1992 | Belsan | 395/425 |
| 5,163,131 | 11/1992 | Row et al. | 395/200 |

OTHER PUBLICATIONS

"A Case for Redundant Arrays of Inexpensive Disks (RAID)", by David A. Patterson et al., University of California Berkeley, Report No. UCB/CSD 87/391, Dec. 1987.

*Primary Examiner*—Robert W. Beausoliel, Jr.
*Assistant Examiner*—Joseph E. Palys
*Attorney, Agent, or Firm*—Blakeley, Sokoloff, Taylor & Zafman

[57] ABSTRACT

The disk array control system is a fault tolerant controller for arrays of hard disk drives. With the controller as a front end, an array of hard disk drives would appear as a single drive to a host computer system connected to the controller. The controller translates input/output data transfer requests from the host system to input/output data transfer requests for the appropriate drives in the drive array. To minimize latency, translation techniques provide for a minimal number of accesses to the drives in the array. Queued input/output requests are supported, and, to maximize throughput, optimal scheduling techniques are used to optimize resource usage and minimize drive access overheads. Means are provided for detecting module failures, sustaining operation after failure, and replacing faulty modules without interrupting service.

32 Claims, 13 Drawing Sheets

```
RAID0read( logicalAddr, numOfBlocks ) {
    remainingBlocks = numOfBlocks;
    firstRank = YES; i = 0;

channel = GetChannel(logicalAddr); /* eq. 4 */
    while( remainingBlocks > 0) {
        if(firstRank == YES) { /* Issue READ command to 1st rank of drives */
            rank[i] = GetRank(LogicalAddr); /* eq. 5 */
            totalLength[i] = 0;
            physicalAddr = GetPhysicalAddr(logicalAddr,channel,rank[i]); /* eq. 6 */
            /*eq.7 */
            length = GetLength(physicalAddr,i,totalLength,rank[i],numOfBlocks);
            Read(channel,rank[i],physicalAddr,length);
            totalLength[i] = length, rank[i] = rank[i] + 1;
            logicalAddr = logicalAddr + 1;
        }
        else { /* Issue SEEK and then READ commands to add'l ranks of drives */
            physicalAddr = 0;
            /* eq. 8 */
            length = GetLength(physicalAddr,i,totalLength,rank, numOfBlocks);
            Seek(channel,rank,physicalAddr);
            Read(channel,rank,physicalAddr, length);
            totalLength[i] = totalLength[i] + length; rank[i] = rank[i] + 1;
        }
        remainingBlocks = remainingBlocks - length; i = i + 1;
        if(i == NUM_OF_CHANNELS) {
            firstRank = NO; i = 0;
        }
        channel = (channel + 1) modC
    }
}
```

Figure 5

```
RAID0write( logicalAddr, numOfBlocks ) {
        remainingBlocks = numOfBlocks;
        firstRank = YES; i = 0;

channel = GetChannel(logicalAddr); /* eq. 4 */
        while( remainingBlocks > 0) {
                if(firstRank == YES) { /* Issue READ command to 1st rank of drives */
                        rank[i] = GetRank(LogicalAddr); /* eq. 5 */
                        totalLength[i] = 0;
                        physicalAddr = GetPhysicalAddr(logicalAddr,channel,rank[i]); /* eq. 6 */
                        /*eq.7 */
                        length = GetLength(physicalAddr,i,totalLength,rank[i],numOfBlocks);
                        Write(channel,rank[i],physicalAddr,length);
                        totalLength[i] = length, rank[i] = rank[i] + 1;
                        logicalAddr = logicalAddr + 1;
                }
                else { /* Issue SEEK and then READ commands to add'l ranks of drives */
                        physicalAddr = 0;
                        /* eq. 8 */
                        length = GetLength(physicalAddr,i,totalLength,rank, numOfBlocks);
                        Seek(channel,rank,physicalAddr);
                        Write(channel,rank,physicalAddr, length);
                        totalLength[i] = totalLength[i] + length; rank[i] = rank[i] + 1;
                }
                remainingBlocks = remainingBlocks - length; i = i + 1;
                if(i == NUM_OF_CHANNELS) {
                        firstRank = NO; i = 0;
                }
                channel = (channel + 1) modC
        }
}
```

Figure 6

```
RAID1read( logicalAddr, numOfBlocks ) {
        RAID0read( logicalAddr, numOfBlocks, LOGICAL_DRIVE0 );
        RAID0read( logicalAddr, numOfBlocks, LOGICAL_DRIVE1 );
}
```

(a)

```
RAID1write( logicalAddr, numOfBlocks ) {
        RAID0write( logicalAddr, numOfBlocks, LOGICAL_DRIVE0 );
        RAID0write( logicalAddr, numOfBlocks, LOGICAL_DRIVE1 );
}
```

```
RAID3read( logicalAddr, numOfBlocks ) {
        remainingBlocks = numOfBlocks;
        firstRank = YES;

while( remainingBlocks > 0) {
                rank = GetRank3(logicalAddr); /* eq. 9 */
                if(firstRank == YES) { /* Issue READ command to 1st rank of drives */
                        totalLength = 0;
                        physicalAddr = GetPhysicalAddr3(logicalAddr, rank); /* eq. 10 */
                        length = GetLength3(physicalAddr,totalLength,rank, numOfBlocks); /*eq.11 */
                        Read3(rank,physicalAddr, length);
                        totalLength = length;
                }
                else { /* Issue SEEK and then READ commands to add'l ranks of drives */
                        physicalAddr = 0;
                        length = GetLength3(physicalAddr,totalLength, rank,numOfBlocks); /* eq. 12 */
                        Seek3(rank,physicalAddr);
                        Read3(rank,physicalAddr,length);
                        totalLength = totalLength + length;
                }
                remainingBlocks = remainingBlocks - length;
                firstRank = NO;
                logicalAddr = logicalAddr + length;
        }
}
```

Figure 8

```
RAID3write( logicalAddr, numOfBlocks ) {
        remainingBlocks = numOfBlocks;
        firstRank = YES;

while( remainingBlocks > 0) {
                rank = GetRank3(logicalAddr); /* eq. 9 */
                if(firstRank == YES) { /* Issue READ command to 1st rank of drives */
                        totalLength = 0;
                        physicalAddr = GetPhysicalAddr3(logicalAddr, rank); /* eq. 10 */
                        length = GetLength3(physicalAddr,totalLength,rank,numOfBlocks); /*eq.11 */
                        Write3(rank,physicalAddr, length);
                        totalLength = length;
                }
                else( /* Issue SEEK and then READ commands to add'l ranks of drives */
                        physicalAddr = 0;
                        length = GetLength3(physicalAddr,totalLength, rank,numOfBlocks); /* eq. 12 */
                        Seek3(rank,physicalAddr);
                        Write3(rank,physicalAddr, length);
                        totalLength = totalLength + length;
                }
                remainingBlocks = remainingBlocks - length;
                firstRank = NO;
                logicalAddr = logicalAddr + length;
        }
}
```

Figure 9

```
RAID5read( logicalAddr, numOfBlocks ) {
        numOfBlocks = AdjustNumOfBlocks(logicalAddr,numOfBlocks); /* eq. 15 */
        logicalAddr = AdjustLogicalAddr(logicalAddr); /* eq. 15 */
        RAID0read( logicalAddr, numOfBlocks );
}
```

(a)

```
RAID5write( logicalAddr, numOfBlocks ) {
        numOfBlocks = AdjustNumOfBlocks(logicalAddr,numOfBlocks); /* eq. 15 */
        logicalAddr = AdjustLogicalAddr(logicalAddr); /* eq. 15 */
        RAID0write( logicalAddr, numOfBlocks );
}
```

```
RAID0read5( logicalAddr, numOfBlocks ) {
        RAID5read( logicalAddr, numOfBlocks, LOGICAL_DRIVE0 );
        RAID5read( logicalAddr, numOfBlocks, LOGICAL_DRIVE1 );
}
```

(a)

```
RAID0write3( logicalAddr, numOfBlocks ) {
        RAID3write( logicalAddr, numOfBlocks, LOGICAL_DRIVE0 );
        RAID3write( logicalAddr, numOfBlocks, LOGICAL_DRIVE1 );
}
```

FAULT TOLERANT HARD DISK ARRAY CONTROLLER

FIELD OF THE INVENTION

The invention pertains to the field of fault tolerant controllers for arrays of hard disk drives for computer systems. More specifically it pertains to the management of information storage and retrieval on such arrays using modern control theory, including data partitioning techniques, scheduling techniques for queued input/output data requests, and recovery techniques in the event of drive and other component failures.

BACKGROUND OF THE INVENTION

Redundant Arrays of Inexpensive Disks (RAID) systems are beginning to be offered commercially as cost effective mass storage providing reliable and continuous service to a host computer or network file server. These arrays of hard disk drives are managed by a (hardware or software) controller to appear to the host system as a single drive having a large contiguous set of "logical" data blocks. A typical input/output (I/O) request from the host computer is translated into a data transfer from one or more of the physical drives. The goal is to select the physical array structure and to map the logical data blocks to the physical drives in a manner that provides fault tolerance to drive failures and that facilitates efficient data transfer rates. Redundant data or parity data is used to recover data that is lost when a drive fails.

Several storage formats, termed "RAID levels", for byte or block striping data across the drives have become popular—e.g. RAID-0 (block striped), RAID-1 (mirrored block data), RAID-3 (byte striped with a parity drive), and RAID-5 (block striped with a parity block). See "A Case for Redundant Arrays of Inexpensive Disks (RAID)", by David A. Patterson et al., University of California Berkeley, Report No. UCB/CSD 87/391, Dec. 1987. Data security requirements and typical data access characteristics determines which of these formats is most suitable for a particular application environment. For example, an environment requiring fault tolerance to drive failure, but with typical accesses consisting of large blocks of contiguous data is better supported by RAID-3, while one with typical accesses consisting of random small blocks of data is better supported by RAID-5.

In handling single data access requests from a host system, current RAID control systems incur significant added latency due to the drive array access methods used, and, in handling multiple queued data access requests, they incur reduced throughput due to the scheduling methods used or even the lack of scheduling. The present invention includes innovations to optimize access latency and throughput for single or multiple queued access requests. Due to architectural design, current control systems also have limited, high cost, and complex methods for fault tolerance and expansion. The present invention introduces architectural innovations that reduce cost and complexity.

SUMMARY OF THE INVENTION

The present invention is a fault tolerant controller for arrays of hard disk drives comprising: (1) means for translating I/O data access requests from a host system to I/O requests for the appropriate hard disk drives, (2) means for scheduling order of execution and executing multiple I/O requests in parallel, (3) means for monitoring system operation and automatically diagnosing faulty components, (4) means for sustaining operation after certain component failures, (5) means for replacing certain faulty components without interrupting the operation of the system, (6) means for modular system expansion, and (7) means for coordinating all of the system functions and resources.

One object of the invention is improved I/O throughput and reduced latency over previous systems. New optimal techniques are developed for generating RAID formats on drive arrays of arbitrary dimensions. This allows multiple RAID formats to be configured by software on different portions of the physical drive array simultaneously, and it allows nesting of RAID formats, such as a RAID-0 (mirrored) array with RAID-5 format on each of the mirrored halves. When translating an I/O request from the host computer to I/O operations on the physical drives, the techniques minimize bus arbitration, selection, message passing, seek, and access latency overheads.

New techniques are also developed for scheduling the execution of multiple I/O requests so that a desired performance criterion is optimized, while maximum I/O latency of any single transfer request remains bounded (i.e. service of a request is not delayed indefinitely). One embodiment of the optimized scheduling allows the the use of efficient linear programming methods. Throughput is also improved by detecting I/O requests that are able to execute in parallel and by subsequent parallel execution of these requests.

Another object of the invention is to provide tolerance to failure of key system modules such as disk drives, power supplies, fans, and system hardware controllers. System cost and complexity are reduced by novel approaches for detecting module failures and for module replacement without interrupting operation of the system.

A further object is to achieve a more cost effective, modular, and expandable hardware and software architecture having better utility than past systems.

FIG. 1 is a sytem control hardware 20 and system control software 30 block diagram of a single unit of the system. The system is designed to be modularly expandable into multiple units as illustrated in FIG. 2. Each unit contains expansion ports that are extensions of the drive busses in the Hard Disk Drive Array 12. However, the simple addition of disk drives using the expansion ports and expansion units (FIG. 2), do not require additional RAID Controllers 8. The central software module is Real Time Kernel 14, while the central hardware module is RAID Controller 8. Hard Disk Drive Array 12 is a set of commercially available hard disk drives connected to several drive channel busses and managed by the rest of the system to appear to Host Computer 7 as a single, large capacity hard disk drive (see FIG. 4). The system manages the Hard Disk Drive Array 12 so that it continues to function in the event of failure of some of the drives. Each drive in 12 is individually replaceable without powering down the system. Fans and Power Supplies 11 are hardware modules that are individually monitored, optionally redundunt, and individually replaceable without powering down the system.

RAID Controller 8 is hardware consisting of an embedded microprocessor and special purpose data routing hardware that channels data back and forth between the Hard Disk Drive Array 12 and Host Computer 7 (see FIG. 3). The embedded processor is used to initialize and manage the remaining hardware components. Most of the system software runs on this controller, the only exception being some health monitoring and diagnostic software running on System Fault Monitor 9. Although not required for a basic configuration, Controller 8 is designed so that several may operate in the system simultaneously for additional performance. Because the data bus channels in Hard Disk Drive Array 12 are idle while drive heads are seeking, two controllers can achieve near double the throughput of a single controller if they are accessing data on mutually exclusive physical drives, and additional controllers increase throughput proportionately under similar conditions. Controller 8 is also designed so that additional controllers can function as backup controllers in the event that the primary controller fails to function, and the faulty controller can be replaced without powering down the system.

System Fault Monitor 9 is hardware that monitors the health and status of Fans and Power Supplies 11 of a single system unit. It also controls status indicators on drives in Hard Disk Drive Array 12 that visually report the status (e.g. good, bad, off, on, etc.) of the individual drives. Status data is communicated to the primary RAID controllers using the system Serial Bus. Each expansion unit would also contain System Fault Monitor 9.

In prior art systems, status monitoring hardware is part of system control hardware, and any existing expansion units would require extra wires carrying status and fault data for that unit's fans, drives, and power supplies to flow to each unit containing control hardware. This creates significant extra cost and complexity. According to the present invention, only a single multi-master serial bus carrying fault and status information flows between the the expansion units and the units with RAID Controller 8, regardless of the number of expansion units or the number of units with RAID Controller 8.

Alarm Controller 10 consists of relays that are progammable as normally open or normally closed. The state of the relays is changed in the event that a system fault is detected. External signals can be connected to these relays so that an alarm is triggered when any failure of any module in the system is detected.

Serial Port Controllers 13 consist of hardware that controls multiple serial ports to allow simultaneous communication with several external devices. Real Time Kernel 14 provides software drivers for these ports. During test or repair, a serial port driver is used by System Diagnostics Manager 17 and Kernel Debugger/System Monitor 15 to communicate system status to an external computer. This module can be used by the host computer to read or write all system memory and registers, single step code execution, set break points, and perform other debugging functions. Real Time Kernel 14 also contains a lower level monitor/debugger that operates from read-only-memory (ROM) using only processor registers, i.e. it does not require functional system dynamic-random-access-memory (DRAM).

Direct communication with software running on System Fault Monitor 9 is also supported. Under normal field operation, the System Diagnostics Manager 17 is designed to use the serial communications ports to communicate with external AC power monitoring devices and with a modem. The idea is that if AC power has been externally interrupted (but perhaps temporarily supplied by an external device), the system is informed and can shut down gracefully in the event that power does not return within a prescribed time limit. The controller system can also use a modem to dial and inform a remote location of a module failure, or a remote location can use the modem to download to the system a new version of certain software modules. Multiple RAID Controllers 8 can share serial ports. System Fault Monitor 9 may optionally share serial communications ports or have its own.

Real Time Kernel 14 is an operating system component that provides an abstract interface to system hardware 20 allowing major software modules to be constructed as independent tasks or procedures. It provides task scheduling services, task communication services, memory management services, hardware driver software, interrupt service routines (ISRs), and other utilities that are used to keep the detailed nature of the hardware transparent to the software and to keep the detailed nature of each software module transparent to other modules. The kernel adds significant flexibility to the system. Extensive modifications in the priorities and order of module execution can easily be made from within it without extensive modifications of these modules, and major blocks of hardware or modules of software can be added or changed in the disk array controller system without affecting the rest of the system. Only the kernel may need significant modifications in the case of major hardware changes. The cost of product maintenance and evolution is thereby reduced.

Host Interface Manager 16 is a software module that provides a high level interface to the control hardware in RAID Controller 8 that interfaces to the host computer bus. Low level host communication protocol is encapsulated in this module. The module makes heavy use of a software driver supplied by Real Time Kernel 14 that controls host interface hardware in Raid Controller 8. When the hard disk array controller system is selected by a Host Computer 7 for an I/O operation, an I/O process (IOP) is established in the controller system containing the host's I/O command or request. The IOP exists as an instance of a software data structure that instigates a series of events in the controller system that depend on the host command received. For example, a READ command would result in an appropriate configuration of hardware data paths in 8 and in READ commands being generated for the appropriate drives in Hard Disk Drive Array 12. Additional complexity arises because the controller system may disconnect from the host bus and later reconnect to complete the READ transfer. Meanwhile, new IOP's may be established, queued, and executed in parallel. Thus the IOP is a fundamental software object in the system managed by I/O Process Manager 19.

I/O Process Manager 19 decodes the IOP, performs logical to physical address translations if necessary, queues the IOP for execution, and sends to Data Path Manager 18 any IOP's that call for Hard Disk Drive Array 12 access. Novel optimal techniques for address translation are independent of the number of drive channels and number of drives per channel. This means that the techniques will work on a subarray of the Hard Disk Drive Array 12, which can be partitioned by software into multiple subarrays, each supporting different RAID formats. Certain kinds of RAID format nesting is also possible, such as a RAID-0 (mirrored) array with RAID-5 format on each of the mirrored halves. The techniques minimize bus arbitration, selection, message passing, seek, and access latency overheads.

When host commands allow flexibility in sorting queued IOP's, new optimal techniques for performing the sorting are used. The sorting methods employ modern control techniques for sorting that optimizes a performance measuring function. Parameters in this function are dynamically modified to guarantee that the maximum I/O latency of any single transfer request remains bounded. A "resource matrix" is introduced to track the usage of drive channels in Hard Disk Drive Array 12. Computationally efficient matrix arithmetic is used to detect IOP's that are able to execute in parallel and further sorting of the IOP's is done to take advantage of the detected parallelism. Execution constraints that are explicit in the host command are also maintained.

Data Path Manager 18 provides a high level interface to data path hardware in RAID Controller 8. Low level communication protocol used with Hard Disk Drive Array 12 is encapsulated in this module. The module makes heavy use of a software driver supplied by Real Time Kernel 14 that controls drive array interface and data path control hardware in RAID Controller 8.

System Diagnostics Manager 17 manages the system's responses to fault conditions. It communicates via the serial bus with the System Fault Monitor 9 to periodically update system data structures containing the status of various hardware modules, such as fans, power supplies, drives, and controller boards. In the event of failure of a RAID Controller 8, it handles the transition of control to the redundant controller. It also initiates and manages other system events in response to other types of system faults. For example, if a drive has failed, it may change the state of an alarm relay and send a message to a remote location via a modem attached to the serial port. It also manages tasks such as the reconstruction of data on a new drive inserted to replace a failed drive.

Kernel Debugger and System Monitor 15 provides functions such as unrestricted access to read and write all memory and registers and the ability to set code execution break points. Higher level commands are also provided that, for example, read and display status data of system queues, tasks, task log buffers, and hardware units. Task execution activity is readily assessed because tasks regularly post error and status messages to an internal log buffer which can be read from a serial port using this module. The kernel can also be set up to automatically transmit log buffer messages.

BRIEF DESCRIPTION OF THE DRAWINGS

FIG. 5 is the pseudo-code for a RAID-0 Read procedure.

FIG. 6 is the pseudo-code for a RAID-0 Write procedure.

FIG. 7 is the pseudo-code for RAID-1 Read and Write procedures.

FIG. 8 is the pseudo-code for a RAID-3 Read procedure.

FIG. 9 is the pseudo-code for a RAID-3 Write procedure.

FIG. 10 is the pseudo-code for RAID-5 Read and Write procedures.

FIG. 11 is the pseudo-code for example nested RAID format Read and Write procedures.

DETAILED DESCRIPTION OF THE INVENTION

Figure 1:
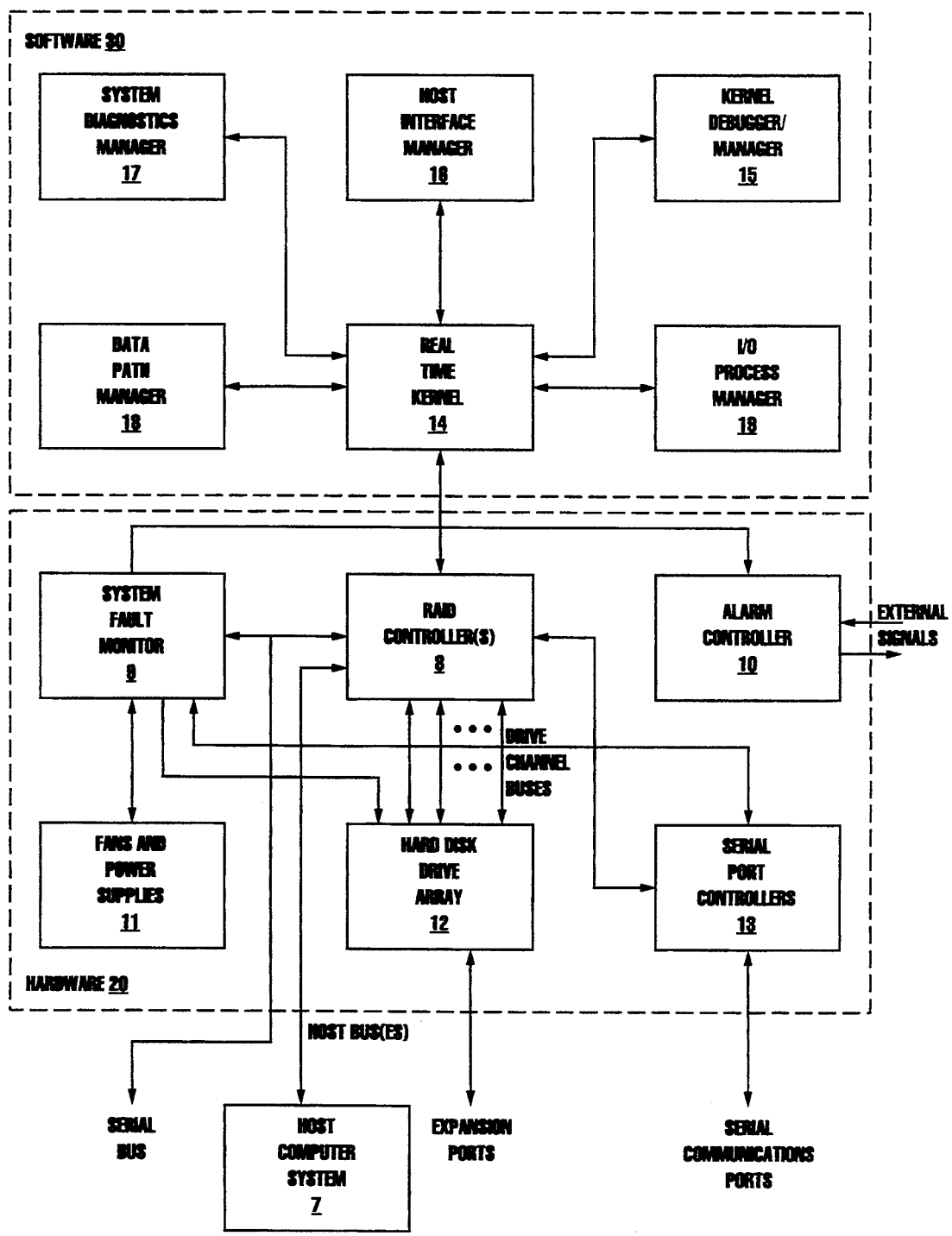
FIG. 1 is a system hardware and software block of the diagram of the hard disk array controller.
Figure 2:
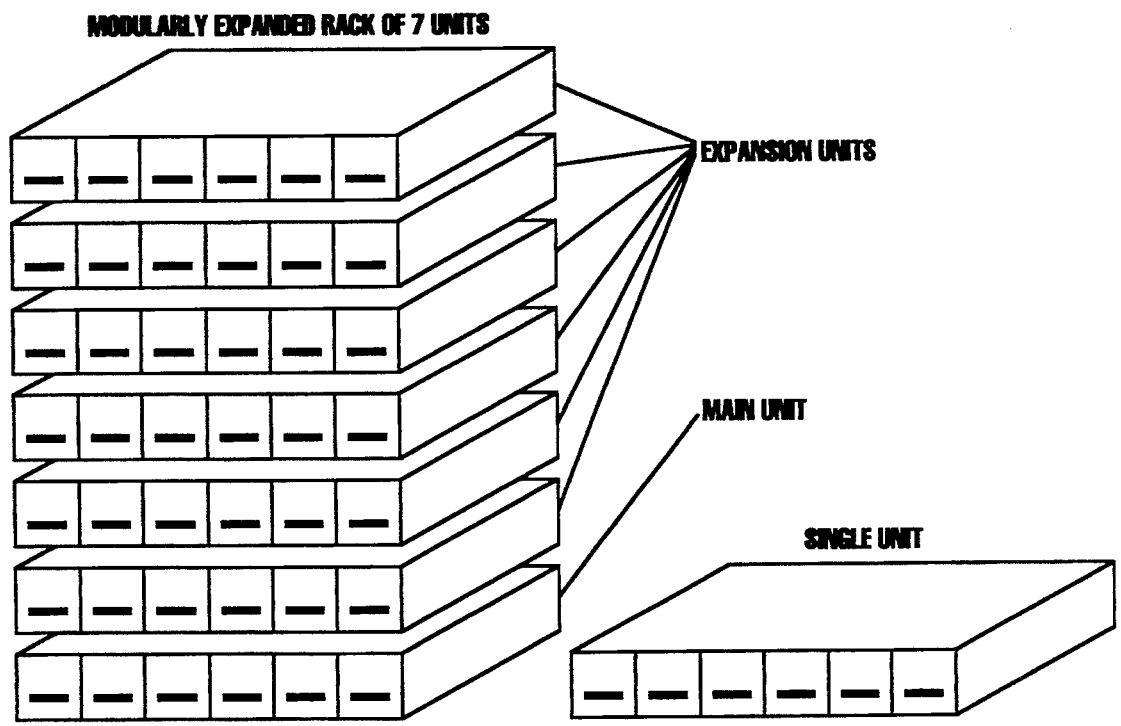
FIG. 2 illustrates the expansion of a single chassis into a system with multiple expansion chassis.

For efficient system cost/performance, the preferred embodiment for hardware 20 of FIG. 1 includes a general purpose microprocessor within RAID Controller 8 that has standard interrupt control, memory, and communications peripherals, together with special purpose data path hardware for coupling Host Computer 7 and Hard Disk Drive Array 12. With present technology, this combination has low cost and supports a new standard of performance by using commercially available VLSI components to form the heart of the data path, and by using a single high performance processor designed for embedded control applications and having a reduced instruction set computer (RISC) architecture. One such processor is the Fujitsu MB86930 which comes with various standard microprocessor peripherals in the MB86940 companion chip (Fujitsu Microelectronics, Inc. 77 Rio Robles, San Jose, Cal. 95134-1807, 1-800-523-0034).

Figure 3:
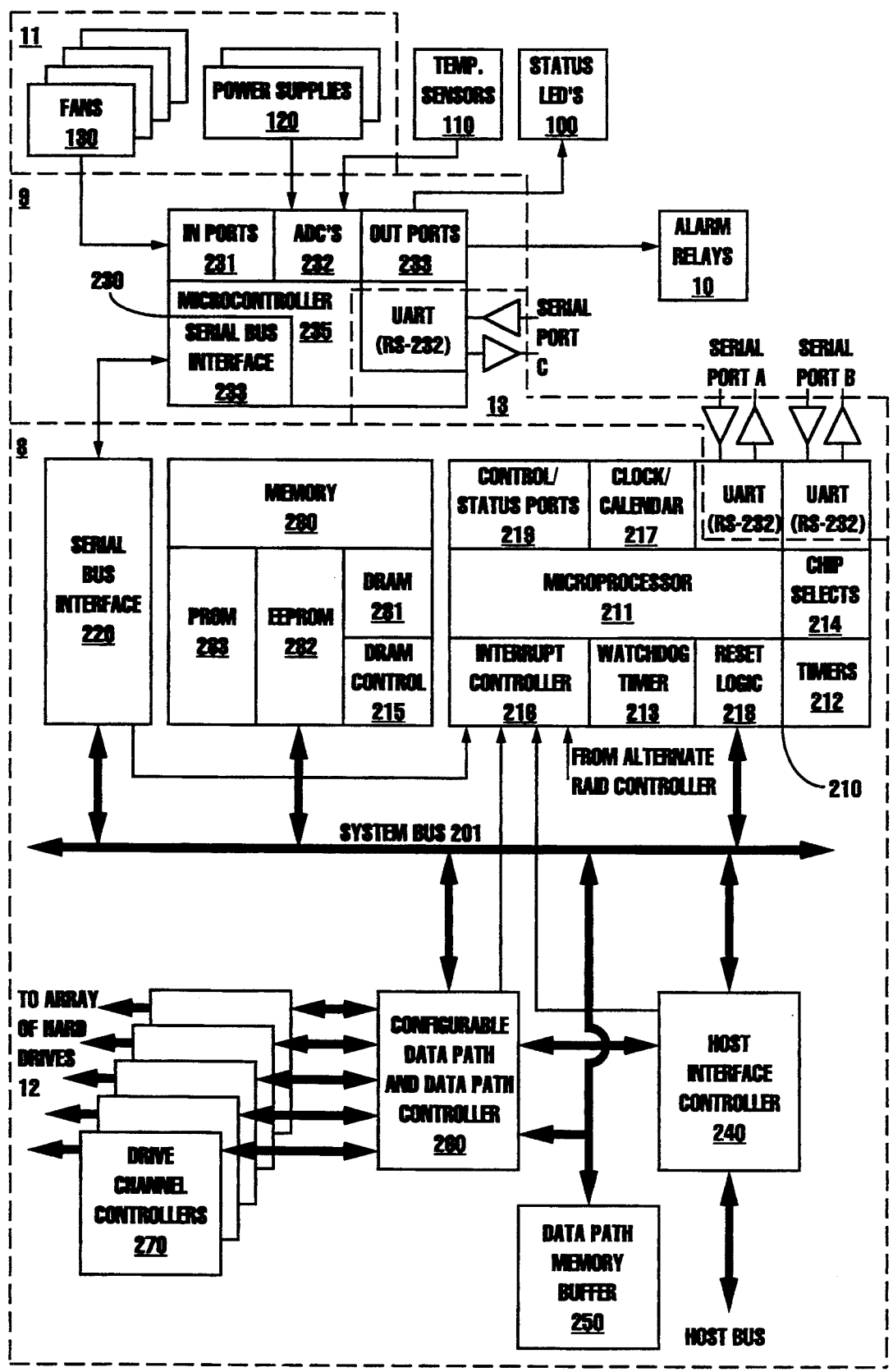
FIG. 3 is a more detailed system hardware block diagram.

An architectural block diagram of a preferred embodiment of hardware, 20 is illustrated in FIG. 3. The components of the block diagram comprise:

Microprocessor System 210: This module is the main component of RAID Controller 8 and contains Microprocessor 211 and standard microprocessor peripherals. Interrupt controller 216 provides a scheme for prioritization and vectoring of interrupt requests. The microprocessor receives interrupts from Serial Bus Interface 220, Serial Ports 13, Data Path Controller 260, Real Time Clock/Calendar 217, Timers 212, Electrically Erasable PROM (EEPROM) 282 ready signal, and Host Interface Controller 240. Timers 212 are used by Real Time Kernel 14 to time share the hardware resources, by software tasks to wait for or instigate events in the future, and possibly by Serial Port Controllers 13 to provide their clock inputs. Clock/Calendar 217 provides day and time information for logging time of occurrence of various system events, such as a failure of a system module. Reset Logic 218 generates reset whenever: (1) power is turned on, (2) a RAID Controller 8 is inserted with power on, (3) an alternate controller generates reset, (4) the host bus generates reset, (5) or the power supply is out of range. All drive array side busses are reset when a controller is inserted with power on. Watchdog Timer 213 detects faulty functioning of the microprocessor. If this timer is not periodically reset by the software, the timer will also generate a microprocessor reset. Programmable Chip Select Units 214 allow software to control the address ranges at which various peripherals are selected. Control/Status Ports 219 includes an encoded write register, a control register, an identification register, and a system status register. In order to change the contents of the encoded write register, a sequence of bytes must be written to it preceding the data byte. This sequence of bytes must not be interrupted by a bus access to any other location. If interrupted, the sequence must be repeated from the beginning. The bits in this register enable and disable critical system functions which should be protected from accidental enabling or disabling by a stray write from software. Some examples are enabling writes to EEPROM 282, enabling/disabling serial communication ports which may propogate alarm signals, and enabling/disabling non-maskable interrupts and other status signals that flow between multiple RAID Controllers 8 in the system. These latter signals are used to transfer control from a faulty controller to a backup controller. The bits in the control register enable and disable less critical system functions, such as DRAM parity checking or a board status light emitting diode (LED). The identification register contains items such as the slot number that RAID Controller 8 is plugged into and a revision number of the hardware. The status register contains various status bits, including parity errors for DRAM 281 memory banks, address error occurred bit, alternate controller status, etc.

System Bus 201: The protocols of this internal bus will largely be determined by the requirements of the particular system microprocessor and the attached peripherals. In one preferred embodiment this bus consists of several closely related busses. One bus is a local bus consisting of address, data, and control lines provided by the microprocessor. A hardware component such as a programmable array logic (PAL) monitors ready lines from the peripherals and generates a ready signal to the processor. A second byte bus consists of latched data buffers and control logic that converts local bus cycles having 1, 2, or 4 data bytes into 1, 2, or 4 cycles respectively on the byte bus, and vice versa. This reduces cost by allowing a 32 bit microprocessor to execute code from a byte wide boot PROM. It also simplifies the perspective from software when 4 byte data types can be directly written to a byte wide peripheral. With control logic, a third byte wide multiplexed address/data bus is created from the local bus to provide a clean interface to byte wide peripherals that require this type of interface.

Serial Bus Interface 220: This module is an interface to a high speed serial bus, such as the I2C bus provided by a Signetics PCD8584 controller (Signetics Corp. 811 East Arques Ave., P.O. Box 3409, Sunnyvale, Cal. 94088-3409). The I2C is a multi-master serial bus that operates at up to 100Kbits/sec. The bus is used for module to module communications between modules in the same chassis or modules in expansion chassis. Modules refer to either RAID Controllers 8 or System Fault Monitors 9.

Memory 280: Boot time initialization and bootstrap loading code is stored in PROM or Erasable PROM (EPROM) Memory 283. Certain system configuration parameters, such as RAID format selection, are stored in non-volatile EEPROM 282. System software is loaded into and executes out of DRAM Memory 281. DRAM Control 215 provides DRAM refresh and support for page mode DRAMs.

Host Interface Controller 240: This module controls and manages low level bus protocol with the host. For a wide and fast Small Computer Systems Interface (SCSI, See "Small Computer System Interface-2". American National Standard X3T9.2/86-109.), an off the shelf controller, such as an Emulex FAS366 SCSI controller (Emulex Micro Devices, 3545 Harbor Boulevard, Costa Mesa, Cal. 92626, (714) 662-5600), would be the main component for this hardware.

Drive Channel Controllers 270: These modules control and manage low level bus protocol for every drive channel on the Hard Disk Drive Array 12. For a standard Small Computer Systems Interface (SCSI) on these channels, an off the shelf controller, such as an Emulex FAS236 SCSI controller or a National Cash Register NCR53C96 controller (NCR Microelectronics, 1635 Aeroplaza Drive, Colorado Springs, Col. 80916, (719) 596-5612), are typical choices for the interface hardware for each channel.

Data Path and Data Path Controller 260: This module controls and contains a data path from the drive channels to the host interface. In one preferred low cost option, an off the shelf controller, such a National Cash Register NCR53C920 data path chip, provides an unbuffered path between the Drive Channel Controllers 270 and Host Interface Controller 240. Data transfer is done by a series of DMA transfers from the hard drives to the host computer. Data Path Memory Buffer 250 would only be used in the event of crippled accesses, i.e. accesses where one of the drives has failed and data must be recovered from the remaining drives. In a preferred higher cost/higher performance option, Memory Buffer 250 is used to buffer data in each direction, for allowing, in some cases, a greater degree of parallelism. However, buffering large amounts of data may create more difficulty in maintaining data integrity in the event of main system modules failing.

Microcontroller System 230: This module contains Micrcontroller 235 with standard microcontroller peripherals. Typically one of these modules is contained in the main system unit, and one is contained in each expansion unit. This module receives pulses into its digital In Ports 231 from Fans 130 indicating rotational frequency of the fans, and it uses analog-to-digital converters (ADCs) 232 to monitor the voltages of Power Supplies 120. It also uses ADCs 232 to monitor input from Temperature Sensors 110 that are located at various points in a single chassis. It also uses digital Out Ports 233 to enable or disable externally visible Status LEDs 100 for fans, power supplies, and hard disk drives in the chassis. Alarm Relays 10 are designed for externally supplied signals to run through them. They are programmable normally open or normally closed relays, where their state is changed by Microcontroller 235 when faults are detected.

Figure 4:
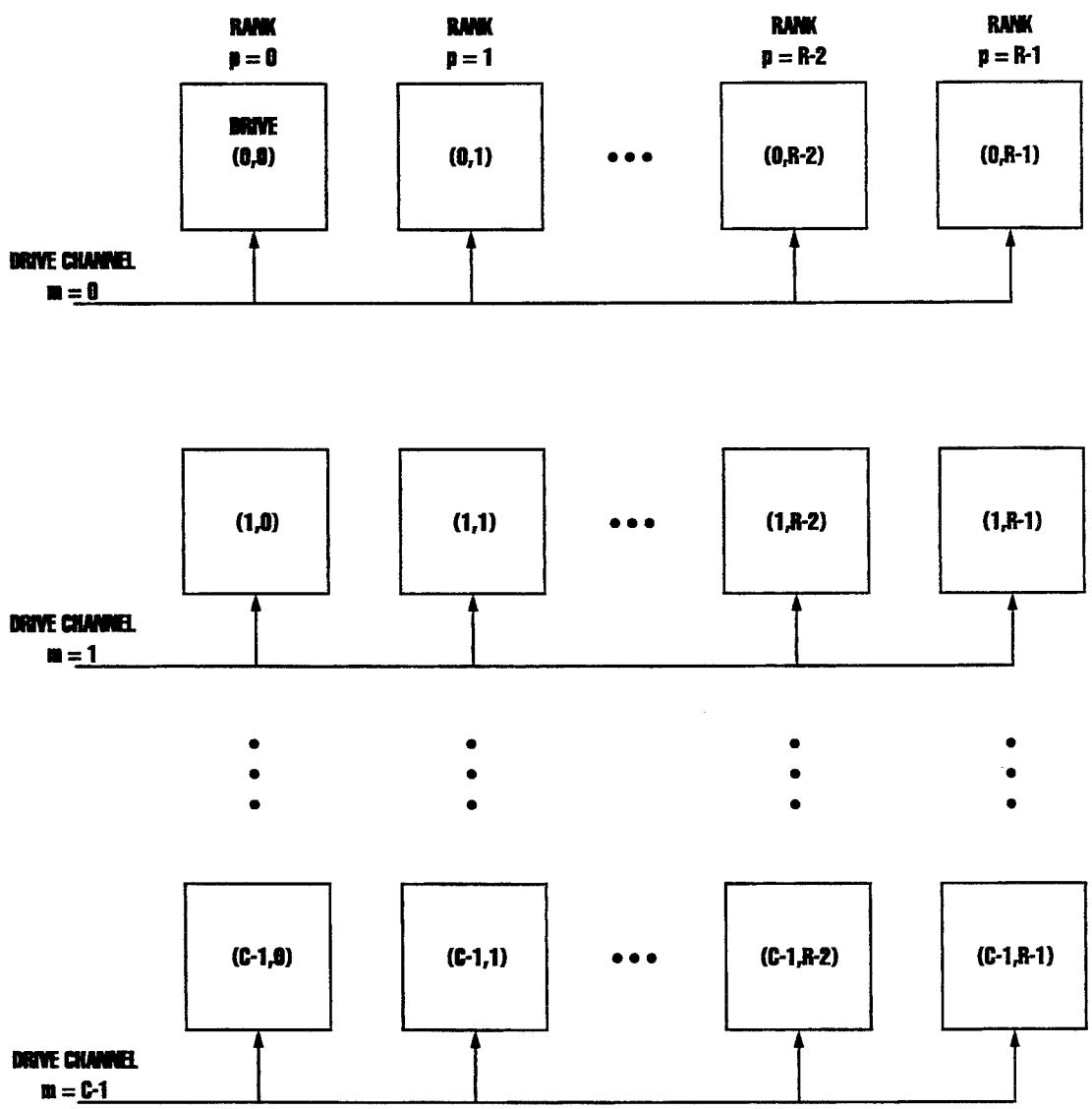
FIG. 4 is a diagram of the basic structure of an array of hard disk drives.

Hard Disk Drive Array 12 consists of a number of drive channels, C; where each drive channel, m, is a data bus shared by a set of R disk drives, as shown in FIG. 4.

Each drive, $D_{m,p}$, in the array is identified by its indices $$0 \leq m \leq C-1 \quad 0 \leq p \leq R-1$$

The index p is referred to as the "rank" of the drive. For example, the rank 6 drive on channel 4 would have the identification, $D_{4,6}$.

A total of L contiguous logical data blocks are divided among the drives in the array. Each logical block is identified by its address or index, $0 \leq n \leq L-1$. A data transfer consists of a read or write of N logical blocks starting with a particular logical block, n, and ending with the logical block $n+N-1$ (An overflow, i.e. $n+N>L$, is treated as an error). The number of bytes in a logical block is a parameter selected when the disk array is formatted (e.g 512 to 8096 bytes), and this number is constrained to be an integer multiple of the number of bytes contained in the typical data block formatted on each drive of the array. Each drive must contain an integer number of the logical blocks. All drives at the same rank, p, contain the same number of logical data blocks, $B_p$. Thus $$L = C \sum_{p=0}^{R-1} B_p$$

A single data I/O transfer request consists of a read or write data transfer of $N \leq L$ contiguous logical blocks starting with block n. The problem is to translate the logical block addresses to physical block addresses on the appropriate drives. Then the data must be transferred from each drive channel in the proper order and combined into a single stream of data and routed back to the host requesting the transfer. Other types of I/O requests exist, such as a request for system status, but these requests are relatively easy to handle. Data transfers represent the main purpose of the system.

Novel techniques detailed below manage and execute I/O transfer requests to minimize the access latency for any single transfer and they sort queued requests for optimal throughput and minimal latency. The techniques assume typical drive characteristics found for example in common interface standards, such as the Small Computer System Interface (SCSI). Such drives respond to commands such as READ, WRITE, and SEEK (position heads to track with specified address), and issue messages such as DISCONNECT (from the bus) and RECONNECT (to the bus).

First, optimal methods for implementing RAID formats on drive arrays of arbitrary dimensions are described. This means that the methods will work on subarrays of the Hard Disk Drive Array 12, where each subarray can be configured with a different RAID format. They are optimal in the sense that only one READ or WRITE command is issued to each physical drive involved in an I/O operation, which minimizes arbitration, selection, message passing, seek, and access latency overheads. The method for the RAID-0 format is central. Methods for RAID-1 and RAID-5 employ the RAID-0 method, and the RAID-3 method is closely related to it.

The following mathematical notation and functions are frequently used. For real x and y and integer a and b,

[x] = the greatest integer less than or equal to x;
a mod b = the remainder when a is divided by b;
min(x,y) = the minimum of x or y;
max(x,y) = the maximum of x or y;

Block Striping (RAID-0):

Block striping turns all of the available memory in the array into data storage and has no redundant or parity data for recovery in the event that any of the drives should fail. This mapping scheme allows parallel accesses of data blocks on each channel and would be the scheme of choice when fault tolerance is not important.

According to the RAID-0 definition, drive $D_{m,p}$ contains logical blocks n, where $$nE\{M_pC+m, (M_p+1)C+m, (M_p+2)C+m, \ldots , (M_p+B_p-1)C+m\}$$

and where $$M_p = \sum_{k=0}^{p-1} B_k \text{ and } M_0 = 0$$

For example, the following list shows the indices for the logical blocks n contained in the indicated drives:

$D_{0,0} \rightarrow nE\{0, C, 2C, \ldots, (B_0-1)C\}$
$D_{1,0} \rightarrow nE\{1, C+1, 2C+1, \ldots, (B_0-1)C+1\}$
$D_{2,0} \rightarrow nE\{2, C+2, 2C+2, \ldots, (B_0-1)C+2\}$ $D_{m,0} \rightarrow nE\{m, C+m, 2C+m, \ldots, (B_0-1)C+m\}$ $D_{c-1,0} \rightarrow nE\{C-1, 2C-1, 3C-1, \ldots, B_0C-1\}$
$D_{0,1} \rightarrow nE\{B_0C, (B_0+1)C, \ldots, (B_0+B_1-1)C\}$
$D_{1,1} \rightarrow nE\{B_0C+1, (B_0+1)C+1, (B_0+2)C+1 \ldots, (B_0+B_1-1)C+1\}$
$D_{2,1} \rightarrow nE\{B_0C+2, (B_0+1)C+2, (B_0+2)C+2 \ldots, (B_0+B_1-1)C+2\}$ $D_{m,1} \rightarrow nE\{B_0C+m, (B_0+1)C+m, (B_0+2)C+m \ldots, (B_0+B_1-1)C+m\}$ $D_{c-1,1} \rightarrow nE\{(B_0+1)C-1, (B_0+2)C-1, (B_0+3)C-1 \ldots, (B_0+B_1)C-1\{$ etc.

From the definition of RAID-0, it can be seen that the drive channel, m, containing a particular block n is given by $$n = (M_p+l)C+m \text{ where } l = 0, 1, 2, 3, \ldots, B_p-1$$

so that $$m = n \bmod C \qquad (1)$$

and the drive's rank, p, satisfies $$M_pC \leq n \leq M_{p+1}C \qquad (2)$$

Counting the number of blocks less than n on channel m and subtracting the total number of blocks in lower ranks of drives yields the physical address of n on drive $D_{m,p}$:

$$s = \frac{n-m}{C} - M_p \qquad (3)$$

All of the logical blocks can be transferred to or from the appropriate physical drives by sequentially reading or writing the N physical blocks $$\frac{(n+i) - (n+i) \bmod C}{C} - M_p$$

of drive $D_{(n+i) \bmod C, p}$ for i=0 to i=N-1. However, this is generally not an efficient procedure, since there is a large amount of bus arbitration, selection, and message passing overhead in issuing multiple READ or WRITE commands to each physical drive involved in the transfer.

A more efficient process is to determine first each physical drive, $D_{m,p}$, involved in the transfer and to determine the starting address and length of the required physical blocks from each drive. Only one WRITE or READ command need be issued to each drive to complete the transfer. However, the RAID Controller 8 becomes more complex because it must interleave the data transferred from or to each channel. The availability of such a controller leads to an efficient procedure as described below.

If all the drives on channel m are viewed as one "logical" drive, $D_m$, the first step is to map the N logical blocks to the drives $D_m$. The listings in the first two columns of Table 1 are expressions of equations 1 and 3 for each channel with p=0. The last column contains expressions for transfer length. The transfer length is a count of the number of blocks to transfer on each channel, where $K_1 = N \bmod C$, $K_2 = [N/C]$, and

TABLE 1

RAID-0: Blocks on Each Channel $$\sigma(x) = \begin{cases} 1 \text{ for } x > 0 \\ 0 \text{ otherwise} \end{cases}$$

| Channel number (m) | Start Address on $D_m$ | Transfer Length |
|---|---|---|
| n mod C | $\lfloor n/C \rfloor$ | $K_2 + \sigma(K_1)$ |
| (n + 1) mod C | $\lfloor (n + 1)/C \rfloor$ | $K_2 + \sigma(L_1 - 1)$ |
| ... | ... | ... |
| (n + C − 1) mod C | $\lfloor (n + C - 1)/C \rfloor$ | $K_2 + \sigma(K_1 - C + 1)$ |

Note that if N<C the transfer length on some of the channels is 0, which means that these channels are not involved in the transfer. Also, the correct order of channel access to interleave the outgoing data or separate the incoming data is from the top row to the bottom row in Table 1.

The next step is to map each channel's logical blocks to physical blocks, and to determine the first drives on each channel involved in the transfer. For channel $$m_i = (n+i) \bmod C \tag{4}$$

where $0 \leq i \leq C-1$, the first drive $D_{mi,pi}$ has rank $p_i$ that satisfies $$M_{pi}C \leq n+i \leq M_{pi+1}C \tag{5}$$

Using equation 3, the starting block address is given by $$s_i = \frac{(n + i) - m_i}{C} - M_{pi} \tag{6}$$

and using Table 1 the number of blocks to transfer is $$x_i(0) = \min(K_2 + \sigma(K_1 - i), B_{pi} - S_i) \tag{7}$$

where $B_{pi} - s_i$ is the available blocks on drive $D_{mi,pi}$ between the address $s_i$ and the end of the drive. These formulas define the parameters of READ or WRITE commands that should be issued to the first drive of each channel involved in the transfer.

If $x_i(0) < K_2 + \sigma(K_1 - i)$, additional higher rank drives are involved in the transfer. In this case, the next rank is $p_i + 1$, the starting address is 0, and the number of blocks to transfer is $$x_i(1) = \max(0, \min(K_2 + \sigma(K_1 - i) - x_i(0), B_{(pi+1)}))$$

Additional drives of rank $p_i + j$ and starting block addresses of 0 are involved in the transfer if $$x_i(j) = \tag{8}$$

$$\max\left(0, \min\left(K_2 + \sigma(K_1 - i) - \sum_{k=0}^{j-1} x_i(k), B_{(pi+j)}\right)\right) > 0$$

After READ or WRITE commands have been issued to the first drive on each channel, SEEK commands should be issued to the second drive (if the first one disconnects from the bus). After the first drive has completed and READ or WRITE commands have been issued to the second drive on each channel, SEEK commands should be issued to the third drive (if the second one disconnects); and so on until all drives involved have completed their transfers.

The pseudo-code program of FIG. 5, written in the style of a C-language program, describes a RAID-0 Read procedure implemented by I/O Process Manager 19. The Read() and Seek() functions in this pseudo-code are requests to Data Path Manager 18 for channelling data back to the host. A RAID-0 Write procedure is exactly the same as a Read, except that all physical drive READ commands are replaced with WRITES, as shown in FIG. 6.

Block Striping, Mirrored Data (RAID-1):

In this scheme the rectangular Hard Disk Drive Array 12 is divided along channel or along rank boundaries into equal sized subarrays, and data is duplicated on each subarray. Duplicating data provides tolerance to one drive failure in each corresponding position in the subarrays, but has severe storage capacity penalties. In the typical case of dividing the array into two identical subarrays (This is the RAID-1 scheme) storage capacity is reduced by 50%. For simplicity the remainder of this section describes the case of two identical subarrays, but the scheme is not limited to this case.

A convenient way to think of the subarrays is as two independent logical drives. In this case, a RAID-1 Read could be expressed in terms of a RAID-0 Read, as shown in FIG. 7(a). The RAID-0 Read function's arguments are extended to include a logical drive designation. RAID-0 Reads are then issued to both drives in parallel in order to start a race. Data is taken from the the logical drive that returns with the information first. If the other drive is not faulty and returns identical data, it is not used. If there are failures in the underlying physical drives composing the logical drives, a "crippled" mode of functioning interleaves data from both logical drives to complete the transfer. Data from one logical drive is also used to rebuild the proper data onto a replacement drive for the faulty drive.

Similarly, a RAID-1 Write is expressed as shown in FIG. 7(b). Although some performance is lost because two writes are done, the system remains functional as long as at least one of each of the mirrored physical drives is functional.

If the drives are available, it is generally better to form the subarrays by dividing the array along a rank boundary, as opposed to a channel boundary. If the typical access involves the transfer of large numbers of blocks and therefore uses all channels, this distinction is not important. However, if there are many accesses transferring small numbers of blocks, having more channels for each subarray would allow more of these small accesses to be processed in parallel.

Byte Striping (RAID-3):

In this scheme data is byte striped across all channels except for one that is reserved to store parity data. Each logical data block is split equally among corresponding physical blocks on each data channel. When a data channel drive fails, a crippled operating mode uses the parity drive to generate the data that is lost and rebuild data onto a replacement drive. One physical drive per rank can fail and the system will continue to function, albeit with less performance. Storage capacity is reduced by 100/C %.

Because each transfer involves all data channels symmetrically, the mapping for this scheme is simpler than for RAID-0 or RAID-1. However, the mapping is similar to that for RAID-0. Instead of interpreting $B_p$ as the number of logical data blocks contained in each physical drive of rank p, as before, interpret $B_p$ as the number of logical blocks contained in ALL physical drives at rank p. Then $M_p$ is $$M_p = \sum_{k=0}^{p-1} B_k \text{ and } M_0 = 0$$

This is reasonable because RAID 3 always uses all the drive channels, since a single logical block is always divided across all C−1 physical blocks (one physical block per channel).

With C=1 equations 2 and 3 give the rank, p, of the first set of drives involved in the transfer, $$M_p \leq n \leq M_{p+1} \quad (9)$$

and the starting block address on each drive, $$s = n - M_p \quad (10)$$

Similary, equation 7 gives the number of blocks to transfer, $$x(0) = \min(N, B_p - s) \quad (11)$$

These formulas define the parameters of READ or WRITE commands that should be issued to each drive on each drive channel (data and parity) simultaneously.

If each logical block has byte numbers 0 to V bytes, where V is an integer multiple of C−1, the bytes on data channel $0 \leq i \leq C-1$ are $$i, C-1+i, 2C-2+i, 3C-3+i, \ldots, V-C+1-i$$

Channel C−1 is the parity channel. With no faulty drives, data transfers sequentially interleave the bytes on channels $0 \leq i < C-1$, and the parity byte is written on channel C−1 during a Write operation. If a drive fails, only the Read operation changes in that it reconstructs data using the corresponding parity drive.

If x(0)<N, additional higher rank drives are involved in the transfer. In this case, the next rank is p+1, the starting address is 0, and the number of blocks to transfer is $$x(1) = \max(0, \min(N - x(0), B_{p+1}))$$

Additional drives of rank, p+j and starting block addresses of 0 are involved in the transfer if $$x(j) = \max\left(0, \min\left(N - \sum_{k=0}^{j-1} x(k), B_{p+j}\right)\right) > 0 \quad (12)$$

After READ or WRITE commands have been issued to the first drive on each channel, SEEK commands should be issued to the second drive (if the first one disconnects from the bus). After the first drive has completed and READ or WRITE commands have been issued to the second drive on each channel, SEEK commands should be issued to the third drive (if the second one disconnects); and so on until all drives involved have completed their transfers.

The C-language like pseudo-code of FIG. 8 describes a RAID-3 Read procedure implemented by I/O Process Manager 19. The Read3() and Seek3() functions in this pseudo-code are requests to Data Path Manager 18 that interleave the data bytes properly, handle faulty drives properly, and channel data back to the host. A RAID-3 Write procedure, as shown in FIG. 9, is similar to a Read in that all physical drive READ commands are replaced with WRITEs. In addition, however, a WRITE command causes parity to be computed and parity drives to be written.

Block Striping with Parity (RAID-5):

One approach to understanding the RAID-5 mapping is to think of it as having the same logical block to physical block mapping as RAID-0, except that some of the logical blocks are reserved for parity blocks. In order to allow multiple I/O operations to proceed in parallel, parity blocks are distributed among all the channels. If one channel were to be dedicated for parity, each I/O Write operation would use it, preventing more than one Write from executing in parallel. In crippled mode, the parity blocks are used to recover data that is lost when a data drive fails and to rebuild data onto a replacement drive. One physical drive per rank can fail and the system will continue to function, albeit with less performance. Storage capacity is reduced by 100/C %.

Let the parity blocks have logical block addresses, n, where $$n \bmod C^2 = 0 \quad (13)$$

$$n \bmod C^2 = C+1$$

$$n \bmod C^2 = 2C+2$$

$$n \bmod C^2 = 3C+3$$

$$n \bmod C^2 = C^2 - 1$$

In this case the number of parity blocks, P(n), between 0 and n, inclusive, is given by $$P(n) = C \left\lfloor \frac{n}{C(C-1)} \right\rfloor + \left\lfloor \frac{n \bmod C(C-1)}{C} \right\rfloor + 1 \quad (14)$$

The first term is the number of parity blocks between 0 (inclusive) and the largest integer multiple of $C^2$ in n (inclusive), and the remaining two terms equal the parity blocks in the remaining addresses greater than the largest integer multiple of $C^2$ in n and less than or equal to n.

For a read or write data transfer of N contiguous logical blocks starting with block n, the RAID-0 mapping procedure can be used if n and N are first modified using equation 14 to account for the parity blocks:

$$n' = n + P(n) \tag{15}$$

$$N' = N + P(n+N-1) - P(n)$$

If $B_p$ is interpreted as the number of logical blocks and parity blocks in each drive at rank p. Then $M_p$ is $$M_p = \sum_{k=0}^{p-1} B_k \text{ and } M_0 = 0$$

and it follows that a RAID-5 Read can be expressed by the pseudo-code shown in FIG. 10(a).

For the above procedure to execute correctly, the Read() requests to Data Path Manager 18 must indicate that a RAID-5, and not a RAID-0, procedure is being executed, or a global system variable indicating RAID-5 must be properly set so that Data Path Manager 18 executes the proper procedure. To execute RAID-5, Data Path Manager 18 determines that block k of drive $D_{m,p}$ is a parity block if and only if $$(C(M_p+k))+m) \bmod C^2 = Cm + m \tag{16}$$

These parity blocks are used to recover data in case one of the physical data block reads fails.

In a RAID-5 Write operation the blocks being overwritten and the corresponding parity blocks must first be read in order to update the parity blocks. In this case parity blocks are identified using equation 16. The C-language type pseudo-code for a RAID-5 Write operation is shown in FIG. 10(b).

Besides the possibility of Hard Disk Drive Array 12 partitioned into multiple subarrays each configured with different RAID formats, certain kinds of RAID format nesting is also possible, such as a read operation for a RAID-0 (mirrored) array with a RAID-5 format on each of the mirrored halves, as illustrated by the pseudo-code in FIG. 11(a), or a write operation for a RAID-0 (mirrored) array with a RAID-3 format on each of the mirrored halves, as illustrated by the pseudo-code in FIG. 11(b).

Scheduling Queued I/O Requests:

The above described procedures show how to efficiently translate a single I/O request for the disk array controller system to one or more I/O requests for the physical drives in Hard Drive Array 12. This section describes how to schedule the order of execution of queued I/O requests to improve throughput.

Under the common SCSI interface standard, a disk drive is given the flexibility to select the execution order of those I/O requests that are marked with a "SIMPLE" queue tag. However, a drive can not select the order of execution of I/O requests that are marked with "ORDERED" or "HEAD OF QUEUE" tags. These request categories must be scheduled according to SCSI-2 protocol. The development in this section applies to the case of SIMPLE queue tags for SCSI systems.

Objectives for the scheduling procedure include:

1. Minimizing the average access time for each physical drive.

2. Maximizing data transfer activity across all channels.

3. Ensuring a bounded latency for any queued I/O request.

Figure 12:
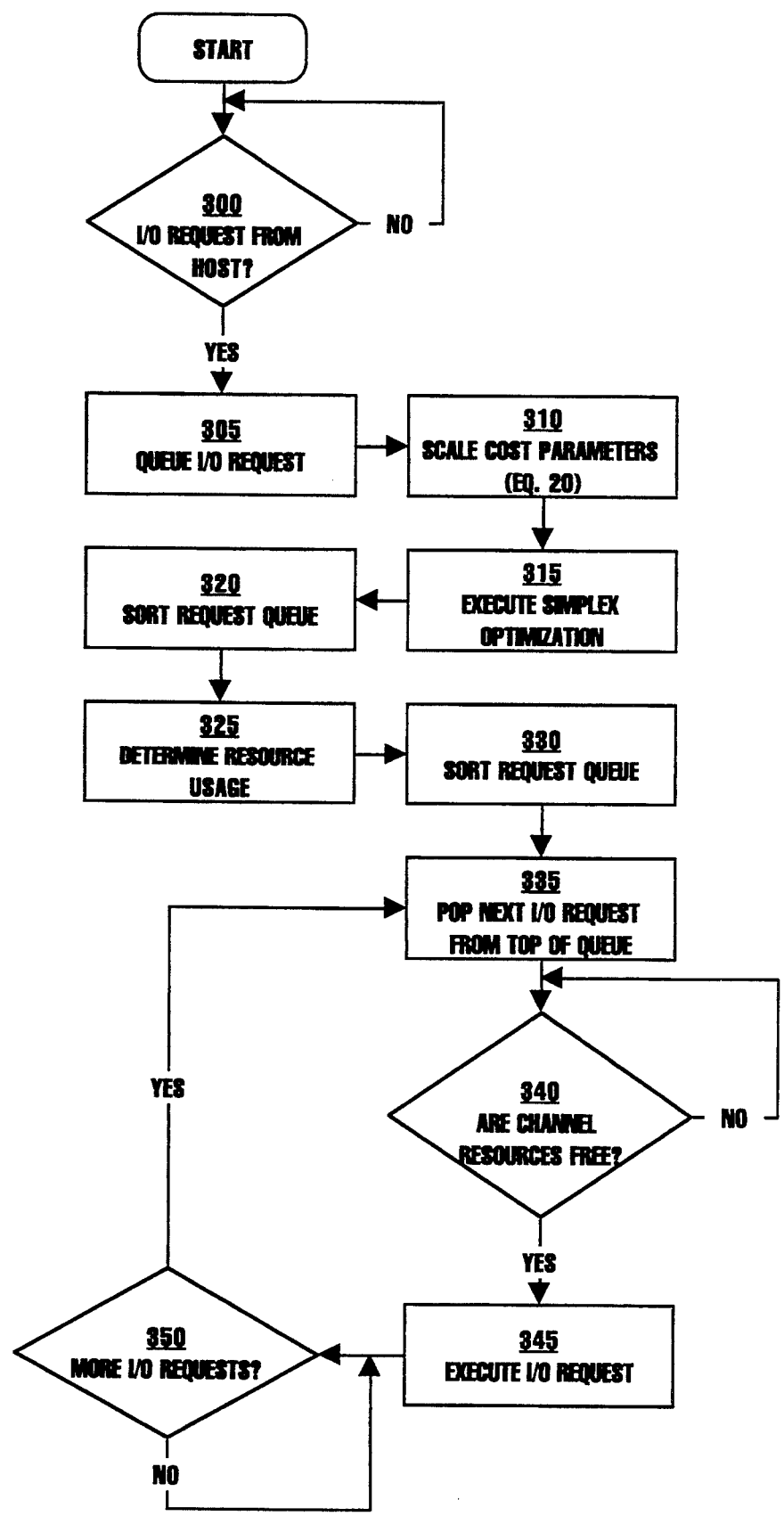
FIG. 12 is a flow chart showing host I/O request scheduling.

The flow chart in FIG. 12 diagrams the scheduling procedure. Modules 300, 305, 310, 315, 320, 325 and 330 are part of I/O Process Manager 19, while modules 335, 340, 345, and 350 are part of Data Path Manager 18.

First host I/O requests are received by module 300. An I/O request consists of a read or write of N logical blocks starting with a particular logical block, n, and ending with the logical block $n+N-1$. Suppose that m I/O requests have been received and queued by module 305, $$n_1 \text{ to } n_1+N_1-1$$

$$n_2 \text{ to } n_2+N_2-1$$

$$n_3 \text{ to } n_3+N_3-1$$

$$n_m \text{ to } n_m+N_m-1 \tag{17}$$

The request with start address $n_j$ will be referred to as the $j^{th}$ request. The problem is to schedule the execution of these requests so that the above objectives are met.

Figure 13:
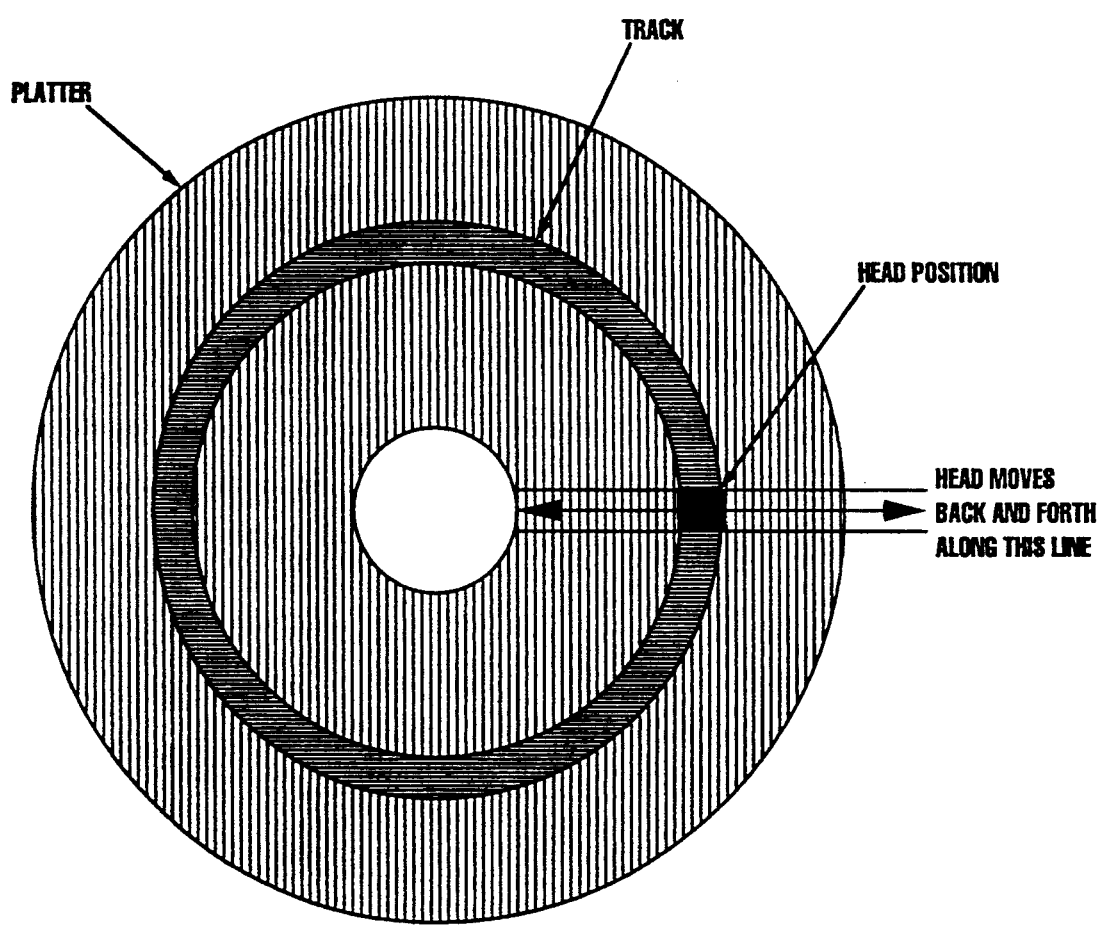
FIG. 13 is a plan view diagram of a single platter internal to a typical hard disk drive.

The RAID procedures described previously minimized the number of physical drive accesses, which minimized added latency due to bus cycle overheads. In scheduling multiple I/O requests, an important factor to minimize is the mechanical seek time of the physical drives, i.e., the time required for a drive to position its heads over the appropriate tracks containing the required blocks of data. FIG. 13 diagrams a single head and its movement on a single platter. Most disk drives have multiple heads moving in parallel across the front and back of several platters. The coinciding tracks form a cylinder containing the desired data blocks.

The seek time between I/O requests is approximated to be proportional to the difference or gap between ,the last data block address that is accessed in the last I/O request and the first data block address that is accessed in the next I/O request. This is reasonable because a drive's heads will generally require more time to position themselves the larger is the gap between these addresses. However, actual seek time in any particular case depends on platter geometry and the distribution of blocks on the platter, and average seek time may not even be linearly proportional to this address gap if outer tracks contain more data blocks than inner tracks, for example. Nevertheless, the fact that larger address differences generally imply longer seek times makes this approximation useful. When the addresses are logical addresses, the same argument suggests that total seek time on the physical drives can be approximated as proportional to the logical address gaps. The reason is that the logical addresses map to one or more physical addresses whose relative separations in the physical drives are similar in pattern.

If the last address accessed (or the initial address) is represented by $n_0+N_0$, the total sum, D, of the address gaps in a queued set of I/O processes is equal to $$D = \sum_{i=0}^{m-1} \sum_{i=1}^{m} |n_i + N_i - n_j| \cdot x_{ij} \text{ subject to} \tag{18}$$

$$\sum_{i=0}^{m-1} x_{ij} = 1, \text{ for } j = 1, 2, \ldots, m$$

-continued $$\sum_{j=1}^{m} x_{ij} = 1, \text{ for } i = 0, 1, 2, \ldots, m-1$$

$x_{ij} \in \{0, 1\}, x_{ii} = x_{jj} = 0$

An optimal schedule is associated with a solution $x_{ij}$ to $$\text{maximize} \sum_{i=0}^{m-1} \sum_{j=1}^{m} -|n_i + N_i - n_j| \cdot x_{ij} \text{ subject to} \quad (19)$$

$$\sum_{i=0}^{m-1} x_{ij} = 1, \text{ for } j = 1, 2, \ldots, m$$

$$\sum_{j=1}^{m} x_{ij} = 1, \text{ for } i = 0, 1, 2, \ldots, m-1$$

$x_{ij} \in \{0, 1\}, x_{ii} = x_{jj} = 0$

The book "Linear Network Optimization: Algorithms and Codes", by Dimitri Bertsekas, The MIT Press, 1991, presents several types of linear programs, such as the well known Simplex Optimization 315, that can be used to find the optimal solution to this problem.

After a solution to equation 19 is computed, the solution is used by module 320 to sort the request queue for an optimal schedule. When $x_{ij}=1$, I/O request j follows I/O request i in an optimal schedule. Think of the $x_{ij}$ as elements of an m+1 by m matrix. Each row and each column of this matrix has exactly one nonzero element equal to 1. Starting with row 0, search for the row element with value 1. The matrix column index of this element, say k, gives the number of the first I/O request to execute in an optimum schedule. Then search row k for the row element with value 1. The matrix column index of this element gives the number of the next I/O request to execute in an optimum schedule. Repeat until all matrix rows have been searched.

The resulting optimal schedule, however, does not guarantee that there will not be unbounded latencies for a particular I/O request. One method for guaranteeing bounded latencies is to periodically reduce the "cost parameters" (i.e. the coefficients of $x_{ij}$, $-|n_i+N_i-n_j|$, in equation 19) associated with particular I/O requests when they have been scheduled behind new requests. This will bias the scheduling to select requests that have been waiting for longer periods of time. For example, the cost parameters associated with the I/O request k having starting address $n_k$ are $-|n_i+N_i-n_k|$ where $i=0, 1, 2, \ldots, m-1$ One example of a method to reduce $n_k$'s cost parameters is to scale them by a power of 2 (division reduces to shifting for this scaling), $$\frac{-|n_i + N_i - n_k|}{2^{d_k}} \text{ where } i = 0, 1, 2, \ldots, m-1 \quad (20)$$

where $d_k$ counts the number of times a new I/O request has caused a new scheduling without request k being executed. This scaling is done by module 310 of FIG. 12. With this modification, the optimization problem has same general form and with new cost parameters:

$$\text{maximize} \sum_{i=0}^{m-1} \sum_{j=1}^{m} -2^{-d_i} \cdot |n_i + N_i - n_j| \cdot x_{ij} \text{ subject to} \quad (21)$$

-continued $$\sum_{i=0}^{m-1} x_{ij} = 1, \text{ for } j = 1, 2, \ldots, m$$

$$\sum_{j=1}^{m} x_{ij} = 1, \text{ for } i = 0, 1, 2, \ldots, m-1$$

Simplex Optimization 315 is used to find the optimal solution. I/O latencies are guaranteed to be bounded because the cost parameters will eventually become less than one, causing the associated I/O requests to be placed at the head of the queue.

Although the above process sorts I/O requests to minimize seek time overheads, there is no guarantee that all drive channels are being used effectively. In module 325 this problem is solved by detecting all combinations of I/O requests that are able to access the drive array in parallel. I/O requests are then further sorted by module 330 to allow for parallel execution of requests whenever possible.

After application of a RAID mapping procedure and by accessing the state of the system (crippled or normal functioning), the exact drive channel usage required by a particular I/O process is easily determined. This usage can be represented by a C×1 "resource" vector, p, of 1's and 0's, where C is the number of channels in the drive array. A 1 in the $j^{th}$ row of this column vector indicates that the $j^{th}$ channel is being used by the process, while a 0 indicates that the channel is not being used. Two I/O processes can execute in parallel if the logical AND-ing of their respective resource vectors, $p_1$ and $p_2$, results in the null vector. In this case the vectors are orthogonal, i.e. $p_1^T \cdot p_2 = 0$.

Resource usage is determined by module 325 as follows: Create a resource matrix, A, from the resource vectors of each queued I/O request, $$A = [p_0 p_1 p_2 \ldots p_{m-1}] \quad (22)$$

The 0's in the symmetric product $A^T A$ correspond to resource vectors that are orthogonal and hence indicate all combinations of two I/O processes that can execute in parallel. A 0 in row i and column j indicates that I/O request i can access the array in parallel with request j. However, because $A^T A$ is symmetric, values in the upper or lower diagonal of part $A^T A$ provide the same information, and hence either one of these parts of $A^T A$ can be ignored. When two I/O processes with resource vectors $p_i$ and $p_j$ are scheduled in parallel, a new single resource vector, $q_j = p_i + p_j$, replaces both $p_i$ and $p_j$ to create a new resource matrix, $A_q$, with one less column. The 0's in the product $A_q^T A_q$ indicate all combinations of three I/O processes that can execute in parallel. After combinations of three I/O processes are scheduled, the corresponding orthogonal resource vectors are added and replace the original vectors. The process is repeated until the resource matrix has no upper diagonal 0's.

The top of the sorted host request queue is popped by module 335 and sent to module 340, who checks to see if the required Hard Disk Drive Array 12 channels are free, and, if so, module 345 executes the I/O request. Module 350 then determines if there are more I/O requests, and if so, module 335 executes the next I/O request.

Although this invention disclosure has referred to arrays of hard disk memory, it would be apparent to those practicing the art that the methods and control apparatus described are applicable to other forms of memory performing the same function. Hard Disk Drive Array 12, for example, could be an array of floppy drives, tape drives, or silicon drives (i.e. composed of some form of semiconductor memory). Because optimization of equation 19 for scheduling may not be as useful in the case of silicon drive types as it is in the case of the mechanical drive types, this part of the control system may harmlessly be eliminated, while the other parts are applied.

What is claimed is:

1. A fault tolerant memory array control system for controlling data accesses to and from a host system bus and a memory array of discrete bulk memory units, organized by channel index and rank index, wherein bulk memory units with the same rank index are of a similar type and capacity, and bulk memory units with the same channel index share a common channel data bus, the memory array control system comprising:
   (a) a controller system bus for control and data communication between elements of the memory array control system;
   (b) a microprocessor controller coupled to the controller system bus for performing logical control of the memory array control system elements, the microprocessor controller comprising:
      (i) a microprocessor for executing operating control programs and configuration control programs comprising:
         (aa) a translation program for optimally translating address data of a host logical data access request to the memory array into a minimal set of memory array physical address and length data for accessing appropriate bulk memory units;
         (bb) a scheduling program for determining and executing an optimal sequence of steps by which to execute a queued set of memory array access requests by optimizing a prescribed performance function criterion;
         (cc) a crippled operation program for using module redundancy and parity data encoding methods for sustaining system operation after a bulk memory failure; and
         (dd) a computer kernel control means for coordinating all system functions and resources; and
      (ii) an interrupt controller connected to the microprocessor for accepting and prioritizing externally generated interrupt requests from the host system bus interface and from a drive channel controller;
   (c) a host computer system bus interface coupled to the controller bus;
   (d) a set of more than one drive channel controller, each controller of the set for coupling to a unique common channel data bus for selecting a bulk memory unit, and for control of and data transfers to and from the selected bulk memory unit sharing the common channel data bus;
   (e) a data path unit comprising;
      (i) a data path selector, having an output and more than one input, each input connected to one of the set of drive channel controllers for selecting a drive channel; and
      (ii) a data path coupled to the host system bus interface and connected to the data path selector output for coupling the selected drive channel to the host computer system bus.

2. A fault tolerant memory array control system as in claim 1 further comprising a data configuration program implementing a method for partitioning data amongst the bulk memory units in the memory array so that the configured RAID format is selected based on an intended application.

3. The system of claim 2 wherein the data configuration program method for partitioning data accommodates arbitrary memory array dimensions.

4. The system of claim 2, wherein the data configuration program method for partitioning data accommodates software partitioning of said memory array into multiple subarrays along physical or logical boundaries, where each subarray may be configured with a different RAID format.

5. The system of claim 1 wherein the scheduling program optimization method minimizes the performance function for finding an optimum schedule by using simplex linear programming methods.

6. The system of claim 1 wherein the scheduling program controls means for guaranteeing that the controlled response of the memory array to any particular host computer access request is not delayed indefinitely.

7. The system of claim 1 wherein the scheduling program controls means for servicing of host input and output data transfer request combinations by use of parallel access to the bulk memory units that optimize the prescribed performance function criterion.

8. The system of claim 6 wherein the scheduling program controls scheduling means for determining a sequence for executing a queued set of m host access requests to the memory array, the queued set numbers indexed $1, 2, \ldots, m$, the scheduling means comprising means for:
   (a) prescribing a performance function, D, representative of the latency for all possible sequential orders of accessing the queued set of m host access requests to the memory array, where $$\sum_{i=0}^{m-1} \sum_{j=1}^{m} |n_i + N_i - n_j| \cdot x_{ij},$$

$n_0 + N_0$ is an initial address corresponding to a last address used to access memory, $n_i$ is a memory array address to the $i^{th}$ queued memory array access request, $N_i$ is a memory array block size of the $i^{th}$ queued memory array access request, and $x_{i,j}$ is a binary valued coefficient, $\{0,1\}$, which indicates, when $x_{i,j}=1$, that an $i^{th}$ queued memory access is followed by a $j^{th}$ queued memory access;

(b) minimizing the performance function, D, subject to a set of conditions as follows:

$$\sum_{i=0}^{m} x_{ij} = 1, \text{ for } j = 1, 2, \ldots, m;$$

$$\sum_{j=1}^{m} x_{ij} = 1 \text{ for } i = 0, 1, 2, \ldots, m-1; \text{ and}$$

$$x_{i,j} = 0 \text{ for } i - j;$$

(c) ordering the set of m coefficients, $\{X_{ij}\}$ corresponding to $X_{ij}=1$, obtained by the means for minimizing the performance function, beginning with $x_{0b_1}$, and proceeding to the right as follows:

$$x_{0b_1} x_{b_1b_2} x_{b_2b_3} \cdots x_{b_{m-1}b_m}$$

so that a $j^{th}$ index of a coefficient becomes an $i^{th}$ index of a next right adjacent coefficient; and
- (d) arranging the order of the b-subscript of the m coefficients in ascending order, $b_1 b_2 b_3 \ldots b_m$, for indicating the left to right sequence for ordering the m queued access requests indexed $1, 2, \ldots, m$, so that, by following the order of subscripts, an optimized sequence for accessing the memory array yields an access sequence with minimum latency.

9. The system of claim 8 wherein the means for minimizing the performance function uses linear programming simplex methods.

10. The system as in claim 6 wherein the scheduling program controls scheduling means for determining an ordered sequence for executing a queued set of m host system access requests to the memory array, indexed $1, 2, \ldots, m$, the sequence ensuring a bounded latency for all queued host system access requests by maintaining a count of the number of times a particular access request has been rescheduled without execution, the scheduling means comprises means for:
- (a) prescribing a performance function, D, representative of the latency for all possible sequential orders of accessing the queued set of m host system access requests to the memory array, where $$\sum_{i=0}^{m-1} \sum_{j=1}^{m} 2^{-d_i} \cdot |n_i + N_i - n_j| \cdot x_{ij}$$

$n_0 + N_0$ is an initial address corresponding to a last array physical address used to access memory, $n_i$ is a memory array physical address to the $i^{th}$ queued memory access address, $N_i$ is a parameter indicating the number of blocks to be accessed beginning at address $n_i$, $X_{i,j}$ is a binary valued coefficient, $\{0,1\}$, which indicates, when $x_{ij} = 1$, that a $i^{th}$ queued memory access is followed by a $j^{th}$ queued memory access, and $2^{-d_j}$ is a binary parameter scaling factor in which $d_j$ is a count of the number of times the $j^{th}$ access request has been rescheduled without execution;

- (b) minimizing the performance function, D, subject to a set of conditions as follows:

$$\sum_{i=0}^{m} x_{ij} = 1, \text{ for } j = 1, 2, \ldots, m;$$

$$\sum_{j=1}^{m} x_{ij} = 1 \text{ for } i = 0, 1, 2, \ldots, m-1; \text{ and}$$

$$x_{i,j} = 0 \text{ for } i - j;$$

- (c) ordering the set of m coefficients, $\{x_{ij}\}$, obtained by the means for minimizing the performance function, beginning with $x_{0b_1}$ and proceeding to the right as follows:

$$X_{0b_1} X_{b_1 b_2} X_{b_2 b_3} \ldots X_{b_{m-2} b_{m-1}} X_{b_{m-1} b_m}$$

so that a $j^{th}$ index of a coefficient becomes an $i^{th}$ index of a next right adjacent coefficient; and
- (d) arranging the order the b-subscripts of the m coefficients in ascending order, $b_1 b_2 b_3 \ldots b_m$, for indicating the left to right optimal sequence for ordering the m queued access requests indexed $1, 2, \ldots, m$, so that, by following the order of subscripts, the optimal sequence for accessing the memory array yields an access sequence with minimum latency.

11. The system as in claim 10 wherein the means for minimizing the performance function minimizes the performance function by use of linear programming simplex methods.

12. The system of claim 7 wherein the scheduling means for parallel servicing of memory access requests by use of parallel channel access combinations that optimize the prescribed performance function criterion comprises means for:
- (a) forming a set of channel usage column vectors for each queued access request wherein each vector component is binary valued, $\{0,1\}$, each component index corresponds to a unique channel index, and each component assumes a value of 1 if the corresponding channel usage is required, otherwise assuming a value of 0;
- (b) ordering the column vectors to form a usage matrix, A, so that each column index corresponds to the access request queue index associated with the vector;
- (c) forming a symmetric resource matrix, $A^T A$, wherein all matrix components of $A^T A$ having a value of 0 indicate that two vectors, respectively, corresponding to the row and column index of $A^T A$ are orthogonal and the corresponding access requests may be performed in parallel, all vectors not identified as orthogonal are non-orthogonal vectors and the corresponding access requests may not be accessed in parallel; and
- (d) sorting queued memory array access requests into pairs of parallel access requests and nonparallel access requests and forming a new queue of parallel and nonparallel executable access requests ordered in accordance with the optimal sequence except that lower optimal sequence indexed access requests that can be executed in parallel with higher indexed requests are executed in parallel; and
- (e) executing access requests as determined by the means for sorting queued memory array access requests.

13. The system of claim 12 wherein additional parallel access to the memory array may be achieved by use of additional scheduling means, comprising means for:
- (a) reducing the size of resource matrix A by adding orthogonal pairs of usage vectors and forming a new usage vector representative of channel resource usage of both vectors, constructing a new resource matrix A whose columns are the new usage vectors plus the non-orthogonal column vectors of resource matrix A;
- (b) forming a symmetric resource matrix $A^T A$, wherein all matrix components of value 0 indicate that two vectors corresponding respectively to the row and column index of the value 0 are orthogonal and the corresponding access requests may be performed in parallel, all vectors not identified as orthogonal are non-orthogonal and the corresponding access requests may not be accessed in parallel;
- (c) sorting queued memory access requests into parallel executable access requests and nonparallel executable access requests in which a new parallel access request is of level three or four corresponding to parallel access by three or four access requests; and (d) optionally repeating, under the scheduling program control, the use of the means for reducing the size of matrix A and the means for forming a symmetric resource matrix, $A^T A$, for identification of additional parallelism if orthogonal usage vectors exist in new matrix A.

14. The system of claim 6 wherein the translation program controls translation means for translating logical access address data to a physical array access address data set for an array of C channels, using a RAID-0 format, the logical access address data described by a starting block address, n, and a block length parameter, N, indicating the number of contiguous blocks to be accessed, and producing a set of channel indices, $\{m_i\}$, a set of channel starting addresses, $\{s_{mi}\}$, and a set of channel transfer length parameters, $\{X_i(j)\}$, indicating the number of contiguous blocks to be accessed for each rank, $p_j$, for each channel, for producing a set of physical access address data requiring a minimal set of access commands, the translation means comprises means for:

(a) mapping the logical block address information given as the logical starting block, n, and the number of contiguous blocks to be accessed, N, into a set of channel indices, $\{m_i\}$, by use of the following relationship:

$$m_i = (n+i) \bmod C$$

where $0 \leq i \leq C-1$ is an index representing the order of accessing the channel corresponding to the value of $m_i$;

(b) identifying the first drive, $D_{m_i,p_i}$, involved in the access, the coordinate parameters $(m_i, p_i)$, satisfying the following conditions:

$$M_{p_i} \leq (n+i)/C < M_{p_i+1}$$

where $$M_{p_i} = \sum_{k=0}^{p_i-1} B_k,$$

$p_i$ is a rank index, and $B_k$ is the number of blocks in rank k;

(c) computing a set of starting physical block addresses for each channel, $\{s_{mi}\}$, as follows:

$$s_{mi} = ((n+i) - m_i)/C - M_{p_i};$$

(d) computing the number of blocks to be accessed, $x_i(0)$, for each channel, $m_i$, as follows:

$$x_i(0) = \min\{(\lfloor N/C \rfloor + \sigma(N \bmod C - i)), (B_{p_i} - s_{mi})\},$$

where $\sigma(\bullet) = 1$ for $(N \bmod C - i) > 0$, and $\sigma(\bullet) = 0$ otherwise;

(e) testing to determine if additional higher ranks are involved in the access by evaluating if:

$$x_i(0) < [N/C] + \sigma(N \bmod C - i);$$

(f) computing the number of data blocks in drive $D_{m_i,p_i+1}$, $x_i(1)$, if $x_i(0) < [N/C] + \sigma(N \bmod C - i)$, using the following expression:

$$x_i(1) = \max\{0, \min\{[N/C] + \sigma(N \bmod C - i) - x_i(0), B_{p_i+1}\}\}; \text{ and}$$

(g) testing to determine if additional higher ranks are involved in the access by evaluating if $x_i(j) > 0$, where $$x_i(j) = \max\left\{0, \min\left\{\left(\lfloor N/C \rfloor + \sigma(N \bmod C - i) - \sum_{k=0}^{j-1} x_i(h)\right), B_{p_i+j}\right\}\right\}$$

so that if $x_i(j) > 0$, $x_i(j)$ represents the number of blocks in drive $D_{m_i,p_i+j}$ involved in the access.

15. The system of claim 6 wherein the translation program controls translation means for translating logical access address data to a physical access address data set, for the array of bulk memories having C channels using a RAID-1 partitioned mirrored data format, the logical access address data described by a starting block address, n, and a block length parameter, N, indicating the number of contiguous blocks to be accessed, and producing a set of channel indices, $\{m_i\}$, a set of channel starting addresses, $\{s_{mi}\}$, and a set of channel transfer length parameters, $\{x_i(j)\}$, indicating the length of access for each rank, $p_j$, involved in the access for each channel, for producing a set of physical access address data requiring a minimal set of access commands, the partitioned memory having a first set of channel and rank coordinates, (m, p), for a first partitioned section of memory, and a second set (m', p') for a second partitioned section of memory, the translation means comprises for the first memory section, using coordinate system (m, p), means for:

(a) mapping the logical block address information given as the logical starting block, n, and the number of contiguous blocks to be accessed, N, into a set of channel indices, $\{m_i\}$, by use of the following relationship:

$$m_i = (n+i) \bmod C$$

where $0 \leq i \leq C-1$ is an index representing the order of accessing the channel corresponding to the value of $m_i$;

(b) identifying the first drive, $D_{m_i,p_i}$, involved in the access, the coordinate parameters $(m_i, p_i)$, satisfying the following conditions:

$$M_{p_i} \leq (n+i)/C < M_{p_i+1}$$

where $$M_{p_i} = \sum_{k=0}^{p_i-1} B_k,$$

$p_i$ is a rank index, and $B_k$ is the number of blocks in rank k;

(c) computing a set of starting physical block addresses for each channel, $\{s_{mi}\}$, as follows:

$$s_{mi} = ((n+i) - m_i)/C - M_{p_i};$$

(d) computing the number of blocks to be accessed, $x_i(0)$, for each channel, $m_i$, as follows:

$$x_i(0) = \min\{([N/C] + \sigma(N \bmod C - i)), (B_{p_i} - s_{mi})\},$$

where $\sigma(\bullet)=1$ for (N mod C−i)>0, and $\sigma(\bullet)=0$ otherwise;

(e) testing to determine if additional higher ranks are involved in the access by evaluating if:

$$x_i(0) < [N/C] + \sigma(N \bmod C - i), \text{ and}$$

if $x_i(0)$ satisfies this condition, computing the number of data blocks in drive $D_{m_i,p_i+1}$, $x_i(1)$, using the following expression:

$$x_i(1) = \max\{0, \min\{[N/C] + \sigma(N \bmod C - i) - x_i(0), B_{p_i+1}\}\}, \text{ and}$$

also to determine if additional higher ranks are involved in the access by evaluating if $x_i(j)>0$ where $$x_i(j) = \max\left\{0, \min\left\{\left(\lfloor N/C \rfloor + \sigma(N \bmod C - i) - \sum_{k=0}^{j-1} x_i(h)\right), B_{p_i+j}\right\}\right\}$$

so that if $x_i(j)>0$, $x_i(j)$ represents the number of blocks in drive $D_{m_i,p_i+j}$ involved in the access;

and for the second memory section, using coordinate system (m′, p′), means for:

(a) mapping the logical block address information given as the logical starting block, n, and the number of contiguous blocks to be accessed, N, into a set of channel indices, $\{m'_i\}$, by use of the following relationship:

$$m'_i = (n+i) \bmod C$$

where $0 \leq i \leq C-1$ is an index representing the order of accessing the channel corresponding to the value of $m'_i$;

(b) identifying the first drive, $D_{m'_i,p'_i}$, involved in the access, the coordinate parameters $(m_i, p_i)$, satisfying the following conditions:
$M_{p'_i} \leq (n+i)/C < M_{p'_i+1}$ where $$M_{p'_i} = \sum_{k=0}^{p'_i-1} B_k, p'_i$$

is a rank index, and $B_k$ is the number of blocks in rank k;

(c) computing a set of starting physical block addresses for each channel, $\{s_{m'_i}\}$, as follows:

$$s_{m'_i} = ((n+i) - m'_i)/C - M_{p'_i};$$

(d) computing the number of blocks to be accessed, $x_i(0)$, for each channel, $m'_i$, as follows:

$$x_i(0) = \min\{([N/C] + \sigma(N \bmod C - i)), (B_{p_i} - s_{m'_i})\};$$

(e) testing to determine if additional higher ranks are involved in the access by evaluating if:

$$x_i(0) < [N/C] + \sigma(N \bmod C - i),$$

and if $x_i(0)$ satisfies this condition, computing the number of data blocks in drive $D_{m'_i,p'_i+1}$, $x_i(1)$, using the following expression:

$$x_i(1) = \max\{0, \min\{[N/C] + \sigma(N \bmod C - i) - x_i(0), B_{p'_i+1}\}\},$$

and also to determine if additional higher ranks are involved in the access by evaluating if $x_i(j)>0$, where $$x_i(j) = \max\left\{0, \min\left\{\left(\lfloor N/C \rfloor + \sigma(N \bmod C - i) - \sum_{k=0}^{j-1} x_i(h)\right), B_{p'_i+j}\right\}\right\}$$

so that if $x_i(j)>0$, $x_i(j)$ represents the number of blocks in drive $D_{m'_i,p'_i+j}$ involved in the access.

16. The system of claim 15 wherein the division of logical array memory is along a rank boundary.

17. The system of claim 15 wherein the division of logical array memory is along a channel boundary.

18. The system of claim 1 wherein the translation program controls translation means for translating logical access address data to a physical array access address data, for an array of C channels and a plurality of rank levels, using a RAID-3 byte striping format, the logical access address data described by a starting block address, n, and a block length parameter, N, indicating the number of blocks to be accessed, and producing a set of rank index, $\{p_j\}$, a starting address index, s, and a set of transfer length parameters, $\{x(j)\}$a, indicating the length of access for each rank, $p_j$, involved in the access, and for producing a set of physical access addresses requiring a minimal set of access commands, the translation means comprising means for:

(a) mapping the logical block address, n, into a rank index, p, that represents the first set of drives involved in the data access and satisfies the condition:

$$M_p \leq n < M_{p+1}$$

where $$M_p = \sum_{k=0}^{p-1} B_k',$$

$M_0=0$ and $B_k'$ is the number of blocks in all memory units in rank k;

(b) computing a starting address, s, for use in accessing each memory unit in rank p, using the relationship:

$$s = n - M_p;$$

(c) computing a number, x(0), indicating how many blocks to access in rank p, where:

$$x(0) = \min\{N, B_p - s\};$$

(d) testing to determine if additional higher ranks are involved in the access by evaluating if:

$$x(0) < N$$

which, if satisfied, indicates that rank p+1 memory units are involved with starting addresses of 0;

(e) determining a number, x(1), indicating the number of blocks in each memory unit of rank p+1 to be accessed as determined by:

$x(1) = \max\{0, \min\{(N-x(0)), B_{p+1}\}\}$; and (f) testing to determine if additional higher ranks, p+j, are involved in the access by evaluating if $x(j)>0$, where $$x(j) = \max\left\{0, \min\left\{\left(N - \sum_{k=0}^{j-1} x(k)\right), B_{p+j}\right\}\right\}$$

so that if $x(j)>0$, $x(j)$ represents the number of blocks, beginning at address 0, in all memory units of rank p+j.

19. The system of claim 6 wherein the translation program controls translation means for translating logical access address data, representative of a starting block index, n, and length index, N, representative of the number of blocks in the access, to a physical array access address data set, for an array of C channels using a RAID-5 block striping format with distributed parity for allowing parallel access operations, the distributed parity blocks located at reserved logical block addresses, $n_j$, where $n_j$ satisfies a constraint condition, $n_j$ mod $C^2 = j(C+1)$ for j=0,1,2 ..., C−1, the physical array access address data set includes a set of channel indices, $\{m_i\}$, a set of channel starting addresses, $\{s_{mi}\}$, and a set of channel transfer length parameters, $\{x_i(j)\}$, indicating the number of blocks in rank j and channel $m_i$ that are involved in the access, for producing a set of physical access address data requiring a minimal set of access commands, the translation means comprises means for:

(a) defining a modified logical block address index, n, and a modified length index, N, satisfying the following conditions:

$n' = n + P(n)$ $N' = N + P(n+N-1) - P(n)$ where $$P(n) = C\left\lfloor \frac{n}{C(C-1)} \right\rfloor + \left\lfloor \frac{n \bmod C(C-1)}{C} \right\rfloor + 1$$

(b) mapping the logical block address information given as the logical starting block, n', and the number of contiguous blocks to be accessed, N', into a set of channel indices, $\{m_i\}$, by use of the following relationship:

$m_i = (n' + i) \bmod C$ where $0 \leq i \leq C-1$ is an index representing the order of accessing the channel corresponding to the value of $m_i$;

(c) identifying the first drive, $D_{m_i,p_i}$, involved in the access, the coordinate parameters $(m_i, p_i)$, satisfying the following conditions:

$M_{pi} \leq (n'+i)/C < M_{pi+1}$ where $$M_{pi} = \sum_{k=0}^{p_i-1} B_k,$$

$p_i$ is a rank index, and $B_k$ is the number of blocks in rank k;

(d) computing a set of starting physical block addresses for each channel, $\{s_{mi}\}$, as follows:

$s_{mi} = ((n'+i) - m_i)/C - M_{pi}$;

(e) computing the number of blocks to be accessed, $x_i(0)$, for each channel, $m_i$, as follows:

$x_i(0) = \min\{(\lfloor N'/C \rfloor + \sigma(N' \bmod C - i)), (B_{pi} - s_{mi})\}$, where $\sigma(\bullet) = 1$ for $(N' \bmod C - i) > 0$, and $\sigma(\bullet) = 0$ otherwise;

(f) testing to determine if additional higher ranks are involved in the access by evaluating if $x_i(0) < \lfloor N'/C \rfloor + \sigma(N' \bmod C - i)$, and if $x_i(0)$ satisfies this condition, computing the number of data blocks in drive $D_{m_i,p_i+1}$, $x_i(1)$, using the expression $x_i(1) = \max\{0, \min\{\lfloor N'/C \rfloor + \sigma(N' \bmod C-i) - x_i(0), B_{pi+1}\}\}$, and to determine if additional higher ranks are involved in the access by evaluating if $x_i(j)>0$, where $$x_i(j) = \max\left\{0, \min\left\{\left(\lfloor N'/C \rfloor + \sigma(N' \bmod C - i) - \sum_{k=0}^{j-1} x_i(h)\right), B_{pi+j}\right\}\right\}$$

so that if $x_i(j)>0$, $x_i(j)$ represents the number of blocks in drive $D_{m_i,p_i+j}$ involved in the access.

20. The system of claim 18 wherein the translation means for translating logical access address data to a physical array access address data set further comprises means for determining that block $k_i$ of drive $D_{m_i,p_i}$ is a parity block, block $k_i$ is a parity block if, and only if, the following expression is true:

$(C(M_{pi}+k_i)+m_i) \bmod C^2 = m_i(C+1)$.

21. A method for translating logical access address data to a physical array access address data set for an array of bulk memories having C channels and a plurality of rank levels, the array using a RAID-0 block striping data format, the logical access address data described by a starting block address, n, and a block length parameter, N, indicating the number of contiguous blocks to be accessed, and producing a set of channel indices, $\{m_i\}$, a set of channel starting addresses, $\{s_{mi}\}$, and a set of channel transfer length parameters, $\{x_i(j)\}$, indicating the length of access for each rank, $p_{ij}$, involved in the access for each channel, for producing an optimal set of physical access addresses requiring a minimal set of access commands, the method comprises:

(a) mapping the logical block address information given as the logical starting block. n, and the number of contiguous blocks to be accessed, N, into a set of channel indices, $\{m_i\}$, by use of the following relationship:

$m_i = (n+i) \bmod C$ where $0 \leq i \leq C-1$ is an index representing the order of accessing the channel corresponding to the value of $m_i$;

(b) identifying the first drive, $D_{mi,pi}$, involved in the access, the coordinate parameters ($m_i$, $p_i$), satisfying the following conditions:

$$M_{pi} \leq (n+i)/C < M_{pi+1}$$

where $$M_{pi} = \sum_{k=0}^{p_i-1} B_k,$$

$p_i$ is a rank index, and $B_k$ is the number of blocks in rank k;

(c) computing a set of starting physical block addresses for each channel, $\{s_{mi}\}$, as follows:

$$s_{mi} = ((n+i) - m_i)/C - M_{pi};$$

(d) computing the number of blocks to be accessed, $x_i(0)$, for each channel, $m_i$, as follows:

$$x_i(0) = \min\{([N/C] + \sigma(N \bmod C - i)), (B_{pi} - s_{mi})\},$$

where $\sigma(\bullet) = 1$ for (N mod C−i)>0, and $\sigma(\bullet) = 0$ otherwise;

(e) testing to determine if additional higher ranks are involved in the access by evaluating if:

$$x_i(0) < [N/C] + \sigma(N \bmod C - i);$$

(f) if $x_i(0)$ satisfies the condition of step (e), computing the number of data blocks in drive $D_{mi,pi+1}$, $x_i(1)$, using the following expression:

$$x_i(1) = \max\{0, \min\{[N/C] + \sigma(N \bmod C - i) - x_i(0), B_{pi+1}\}\}; \text{ and}$$

(g) testing to determine if additional higher ranks are involved in the access by evaluating if $x_i(j) > 0$, where $$x_i(j) = \max\left\{0, \min\left\{\left(\lfloor N/C \rfloor + \sigma(N \bmod C - i) - \sum_{k=0}^{j-1} x_i(h)\right), B_{pi+j}\right\}\right\}$$

so that if $x_i(j) > 0$, $x_i(j)$ represents the number of blocks in drive $D_{mi,pi+j}$ involved in the access.

22. A method for translating logical access address data to a physical array access address data set for an array of bulk memories having C channels and a plurality of rank levels, the array using a RAID-1 partitioned mirrored data format, the logical access address data described by a starting block address, n, and a block length parameter, N, indicating the number of contiguous blocks to be accessed, and producing a set of channel indices, $\{m_i\}$, a set of channel starting addresses, $\{s_{mi}\}$, and a set of channel transfer length parameters, $\{x_i(j)\}$, indicating the number of contiguous blocks to be accessed for each rank, $p_j$, and for each channel, for producing a set of physical access address data requiring a minimal set of access commands, the partitioned mirrored memory having a first set of channel and rank coordinates, (m, p), for a first partitioned section of memory, and a second set, (m', p'), for a second partitioned section of memory, the method comprises:

(a) mapping the logical block address information given as the logical starting block, n, and the number of contiguous blocks to be accessed, N, into a set of channel indices, $\{m_i\}$, by use of the following relationship:

$$m_i = (n+i) \bmod C$$

where $0 \leq i \leq C - 1$ is an index representing the order of accessing the channel corresponding to the value of $m_i$;

(b) identifying the first drive, $D_{mi,pi}$, involved in the access, the coordinate parameters ($m_i$, $p_i$), satisfying the following conditions:

$$M_{pi} \leq (n+i)/C < M_{pi+1}$$

where $$M_{pi} = \sum_{k=0}^{p_i-1} B_k,$$

$p_i$ is a rank index, and $B_k$ is the number of blocks in rank k;

(c) computing a set of starting physical block addresses for each channel, $\{s_{mi}\}$, as follows:

$$s_{mi} = ((n+i) - m_i)/C - M_{pi};$$

(d) computing the number of blocks to be accessed, $x_i(0)$, for each channel, $m_i$, as follows:

$$x_i(0) = \min\{([N/C] + \sigma(N \bmod C - i)), (B_{pi} - s_{mi})\},$$

where $\sigma(\bullet) = 1$ for (N mod C−i)>0, and $\sigma(\bullet) = 0$ otherwise;

(e) testing to determine if additional higher ranks are involved in the access by evaluating if:

$$x_i(0) < [N/C] + \sigma(N \bmod C - i);$$

(f) if $x_i(0)$ satisfies the condition of step (e), computing the number of data blocks in drive $D_{mi,p+1}$, $x_i(1)$, using the following expression:

$$x_i(1) = \max\{0, \min\{[N/C] + \sigma(N \bmod C - i) - x_i(0), B_{pi+1}\}\}; \text{ and}$$

(g) testing to determine if additional higher ranks are involved in the access by evaluating if $x_i(j) > 0$, where $$x_i(j) = \max\left\{0, \min\left\{\left(\lfloor N/C \rfloor + \sigma(N \bmod C - i) - \sum_{k=0}^{j-1} x_i(h)\right), B_{pi+j}\right\}\right\}$$

so that if $x_i(j) > 0$, $x_i(j)$ represents the number of blocks in drive $D_{mi,pi+j}$ involved in the access;

and for the second memory section, use steps (a)-(g) above using coordinate system (m', p').

23. A method for translating logical access address data to a physical array access address data set for an array of bulk memories having C channels and a plurality of rank levels, using a RAID-3 byte striping format, the logical access data described by a starting address, n, and a block length parameter, N, indicating the number of blocks to be accessed, and producing a set of rank index, {$p_j$}, a starting address index s, and a set of transfer length parameters, {x(j)}, indicating the number of contiguous transfers for each rank, $p_j$, and for producing a set of physical access addresses requiring a minimal set of access commands, the method comprises:

(a) mapping the logical block address, n, into a rank index, p, that represents the first set of drives involved in the data access and satisfies the condition:

$$M_p \leq n < M_{p+1}$$

where $$M_p = \sum_{k=0}^{p-1} B_k',$$

$M_0 = 0$ and $B_k'$ is the number of blocks in all memory units in rank k;

(b) computing a starting address, s, for use in accessing each memory unit in rank p, using the relationship:

$$s = n - M_p;$$

(c) computing a number, x(0), indicating how many blocks to access in rank p, where:

$$x(0) = \min \{N, B_p - S\};$$

(d) testing to determine if additional higher ranks are involved in the access by evaluating if:

$$x(0) < N$$

which, if satisfied, indicates that rank p+1 memory units are involved with starting addresses 0;

(e) determining a number, x(1), indicating the number of blocks in each memory unit of rank p+1 to be accessed as determined by:

$$x(1) = \max \{0, \min \{(N - x(0)), B_{p+1}\}\}; \text{ and}$$

(f) testing to determine if additional higher ranks, p+j, are involved in the access by evaluating if x(j) > 0, where $$x(j) = \max \left\{ 0, \min \left\{ \left(N - \sum_{k=0}^{j-1} x(k)\right), B_{p+j} \right\} \right\}$$

so that if x(j) > 0, x(j) represents the number of blocks, beginning at address 0, in all memory units of rank p+j.

24. A method for translating logical access address data to a physical array access address data set for an array of bulk memories having C channels and a plurality of rank levels, using a RAID-5 block striping format with distributed parity for allowing parallel access operations, the distributed parity blocks located at reserved logical block address set, {$n_j$}, where {$n_j$} satisfies a constraint condition, $n_j \mod C^2 = j(C+1)$ for $j = 0, 1, 2, \ldots, C-1$, the physical array access address data set includes a set of channel indices, {$m_i$}, a set of channel starting addresses, {$s_{mi}$}, and a set of channel transfer length parameters, {$x_i(j)$}, indicating the number of blocks in rank j and channel $m_i$ that are involved in the access, for producing a set of physical access address data requiring a minimal set of access commands, the method comprises:

(a) defining a modified logical block address index, n, and a modified length index, N, satisfying the following conditions:

$$n' = n + P(n)$$

$$N' = N + P(n + N - 1) - P(n)$$

where $$P(n) = C \left\lfloor \frac{n}{C(C-1)} \right\rfloor + \left\lfloor \frac{n \mod C(C-1)}{C} \right\rfloor + 1$$

(b) mapping the logical block address information given as the logical starting block, n', and the number of contiguous blocks to be accessed, N', into a set of channel indices, {$m_i$}, by use of the following relationship:

$$m_i = (n' + i) \mod C$$

where $0 \leq i \leq C - 1$ is an index representing the order of accessing the channel corresponding to the value of $m_i$;

(c) identifying the first drive, $D_{m_i,p_i}$, involved in the access, the coordinate parameters ($m_i$, $p_i$), satisfying the following conditions:

$$M_{p_i} \leq (n' + i)/C < M_{p_i+1}$$

where $$M_{p_i} = \sum_{k=0}^{p_i - 1} B_k,$$

$p_i$ is a rank index, and $B_k$ is the number of blocks in rank k;

(d) computing a set of starting physical block addresses for each channel, {$s_{ms}$}, as follows:

$$s_{mi} = ((n' + i) - m_i)/C - M_{p_i};$$

(e) computing the number of blocks to be accessed, $x_i(0)$, for each channel, $m_i$, as follows:

$$x_i(0) = \min\{([N'/C] + \sigma(N' \mod C - i)), (B_{p_i} - s_{mi})\},$$

where $\sigma(\bullet) = 1$ for (N' mod C−i) > 0, and $\sigma(\bullet) = 0$ otherwise;

(f) testing to determine if additional higher ranks are involved in the access by evaluating if:

$$x_i(0) < [N'/C] + \sigma(N' \mod C - i);$$

(g) if $x_i(0)$ satisfies the condition of step (e), computing the number of data blocks in drive $D_{m_i,p_i+1}$, $x_i(1)$, using the following expression:

$$x_i(1) = \max\{0, \min\{[N'/C] + \sigma(N' \mod C - i) - x_i(0), B_{p_i+1}\}\}; \text{ and}$$

(h) testing to determine if additional higher ranks are involved in the access by evaluating if $x_i(j) > 0$, where $$x_i(j) = \max\left\{0, \min\left\{\left(\lfloor N/C \rfloor + \sigma(N \bmod C - i) - \sum_{k=0}^{j-1} x_i(h)\right), B_{pi+j}\right\}\right\}$$

so that if $x_i(j) > 0$, $x_i(j)$ represents the number of blocks in drive $D_{mi,pi+j}$ involved in the access.

25. The method of claim 24 further comprises a step for identifying that block $k_i$ of drive $D_{mi,pi}$ is a parity block by evaluating if the following expression is true, $$(C(M_{pi} + k_i) + m_i) \bmod C^2 = m(C+1),$$

which is only true when $k_i$ is a parity block.

26. A method for accessing a memory array that reduces latency by optimizing parallel access to a memory array of discrete bulk memory units organized by channel index and rank index, wherein bulk memory units with the same rank are of a similar type and capacity, and bulk memory units with the same channel index share a common channel data bus, the method comprising:

(a) receiving an outside request for array memory access, the access identified by a virtual memory address and data block length;

(b) converting virtual address to physical addresses;

(c) forming a memory access queue of all requests received but not executed;

(d) computing the minimum latency order of accessing the queued requests;

(e) sorting the requests in the memory access queue in the minimum latency order obtained in step (d);

(f) determining channel bus resource usage of the queued requests and identifying queued access requests that can be done in parallel;

(g) sorting the memory access queue to reflect parallel accesses that may be accomplished while the order of step (e) is otherwise preserved by executing allowable lower order accesses in parallel with higher order accesses; and (h) accessing the memory array in accordance with the order of the memory access queue of step (g).

27. The method of claim 26 wherein the step of computing the minimum latency order for accessing m queued requests, the requests indexed from 1 to m, comprises:

(a) prescribing a performance function, D, representative of the latency for all possible sequential orders of accessing the queued set of m host access requests to the memory array, where $$\sum_{i=0}^{m-1} \sum_{j=1}^{m} |n_i + N_i - n_j| \cdot x_{ij},$$

$n_0 + N_0$ is an initial address corresponding to a last address used to access memory, $n_i$ is a memory array address to the $i^{th}$ queued memory array access request, $N_i$ is a memory array block size of the $i^{th}$ queued memory array access request, and $x_{i,j}$ is a binary valued coefficient, {0,1}, which indicates, when $x_{i,j}=1$, that an $i^{th}$ queued memory access is followed by a $j^{th}$ queued memory access;

(b) minimizing the performance function, D, subject to a set of conditions as follows:

$$\sum_{i=0}^{m} x_{ij} = 1, \text{ for } j = 1, 2, \ldots, m;$$

$$\sum_{j=1}^{m} x_{ij} = 1 \text{ for } i = 0, 1, 2, \ldots, m-1; \text{ and}$$

$$x_{i,j} = 0 \text{ for } i - j;$$

(c) ordering the set of m coefficients, $\{x_{ij}\}$, obtained in step (b) beginning with $x_{0b1}$, and proceeding to the right as follows:

$$x_{0b_1} x_{b_2 b_2} x_{b_2 b_3} \ldots x_{b_m-1 b_m}$$

so that a $j^{th}$ index of a coefficient becomes an $i^{th}$ index of a next right adjacent coefficient; and (d) arranging the order of the b-subscript of the m coefficients in ascending order, $b_1 b_2 b_3 \ldots b_m$, for indicating the left to right sequence for ordering the m queued access requests indexed 1,2 ..., m, so that, by following the order of subscripts, an optimized sequence for accessing the memory array yields an access sequence with minimum latency.

28. The method of claim 26 wherein the step of computing the minimum latency order for accessing queued requests, indexed 1 to m, so that a bounded latency for all queued memory array access requests is ensured by counting the number of times a particular access request has been rescheduled without execution, the method comprises:

(a) prescribing a performance function, D, representative of the latency for all possible sequential orders of accessing the queued set of m host system access requests to the memory array, where $$D = \sum_{i=0}^{m-1} \sum_{j=1}^{m} 2^{-d_i} \cdot |n_i + N_i - n_j| \cdot x_{ij},$$

$n_0 + N_0$ is an initial address corresponding to a last physical address used to access memory, $n_i$ is a memory array physical address to the $i^{th}$ queued memory access address, $N_i$ is a parameter indicating the number of blocks to be accessed beginning at address $n_i$, $x_{i,j}$ is a binary valued coefficient, {0,1 }, which indicates, when $x_{ij}=1$, that an $i^{th}$ queued memory access is followed by a $j^{th}$ queued memory access, and $2^{-d_j}$ is a binary parameter scaling factor in which $d_j$ is a count of the number of times the $j^{th}$ access request has been rescheduled without execution;

(b) minimizing the performance function, D, subject to a set of conditions as follows:

$$D = \sum_{i=0}^{m-1} \sum_{j=1}^{m} 2^{-d_i} \cdot |n_i + N_i - n_j| \cdot x_{ij},$$

(c) ordering the set of m coefficients, $\{x_{ij}\}$, obtained in step (b) beginning with $x_{0b1}$, and proceeding to the right as follows:

$$x_{0b_1} x_{b_1 b_2} x_{b_2 b_3} \cdots x_{b_m-2 b_m-1} x_{b_m-1 b_m}$$

so that a $j^{th}$ index of a coefficient becomes an $i^{th}$ index of a next right adjacent coefficient; and (d) arranging the order the b-subscripts of the m coefficients in ascending order, $b_1 b_2 b_3 \ldots b_m$, for indicating the left to right optimal sequence for ordering the m queued access requests indexed 1,2 ..., m, so that, by following the order of subscripts, the optimal sequence for accessing the memory array yields an access sequence with minimum latency.

29. The method of claim 26 wherein the step of determining channel bus resource usage of the queued access requests and identifying queued access requests that can be done in parallel, further comprises:
  (a) forming a set of channel usage column vectors, for each queued access request wherein each vector component is binary valued, {0, 1}, each component index corresponds to a unique channel index, and each component assumes a value of 1 if the corresponding channel usage is required, otherwise assuming a value of 0;
  (b) ordering the column vectors, to form a usage matrix, A, so that each column index corresponds to the access request queue index associated with the vector; and
  (c) forming a symmetric resource matrix, $A^TA$, wherein all matrix components of $A^TA$ having a value of 0 indicate that two vectors, respectively corresponding to the row and column index of $A^TA$ are orthogonal and the corresponding access requests may be performed in parallel, all vectors not identified as orthogonal are non-orthogonal vectors and the corresponding access requests may not be accessed in parallel.

30. The method of claim 29 wherein additional parallel access to the memory array may be achieved by the additional steps comprising:
  (a) reducing the size of resource matrix A by adding orthogonal pairs of usage vectors and forming a new usage vector representative of channel resource usage of both vectors, constructing a new resource matrix A whose columns are the new usage vectors and the non-orthogonal column vectors of resource matrix A;
  (b) forming a symmetric resource matrix $A^TA$, wherein all matrix components of value 0 indicate that two vectors corresponding to the row and column index of the value 0 are orthogonal and the corresponding access requests may be performed in parallel, all vectors not identified as orthogonal are non-orthogonal and the corresponding access requests may not be accessed in parallel;
  (c) sorting queued memory access requests into parallel executable access requests and nonparallel executable access requests in which a new parallel access request is of level three or four corresponding to parallel access by three or four access requests; and
  (d) repeating steps (a) and (b) for identification of additional parallelism if orthogonal usage vectors exist in new matrix A, if desired, otherwise terminating the process.

31. The system of claim 1 further comprising a system fault monitor that comprises:
  (a) monitoring means for monitoring and reporting the health and status of the bulk memory units, and of the memory array controller hardware including fans and power supplies; and
  (b) a single-wire serial bus coupled to the monitoring means and to the microprocessor controller for reporting the health and status of the bulk memory units and of the memory array controller hardware.

32. The system of claim 31 further comprising an alarm controller unit that comprises a set of relays whose states represent the health and status of selected elements of the control system, the states being externally accessible.

* * * * *

UNITED STATES PATENT AND TRADEMARK OFFICE,
CERTIFICATE OF CORRECTION

PATENT NO. : 5,367,669      Page 1 of 2
DATED : 11/22/94
INVENTOR(S): Alexander Holland and Peter G. Vavaroutsos It is certified that error appears in the above-identified patent and that said Letters Patent is hereby corrected as shown below:

| | | |
|---|---|---|
| Column 10, Line 6; | Delete "nE"; | Insert in place thereof --n$\in$-- |
| Column 10, Line 16; | Delete "nE"; | Insert in place thereof --n$\in$-- |
| Column 10, Line 17; | Delete "nE"; | Insert in place thereof --n$\in$-- |
| Column 10, Line 18; | Delete "nE"; | Insert in place thereof --n$\in$-- |
| Column 10, Line 20; | Delete "nE"; | Insert in place thereof --n$\in$-- |
| Column 10, Line 22; | Delete "nE"; | Insert in place thereof --n$\in$-- |
| Column 10, Line 23; | Delete "nE"; | Insert in place thereof --n$\in$-- |
| Column 10, Line 24; | Delete "nE"; | Insert in place thereof --n$\in$-- |
| Column 10, Line 26; | Delete "nE"; | Insert in place thereof --n$\in$-- |
| Column 10, Line 29; | Delete "nE"; | Insert in place thereof --n$\in$-- |
| Column 10, Line 33; | Delete "nE"; | Insert in place thereof --n$\in$-- |
| Column 20, Line 30; | Delete "6"; | Insert in place thereof --1-- |
| Column 20, Line 42; | Insert --D=-- before the equation | |

UNITED STATES PATENT AND TRADEMARK OFFICE,
CERTIFICATE OF CORRECTION

PATENT NO. : 5,367,669
DATED : 11/22/94
INVENTOR(S): Alexander Holland and Peter G. Vavaroutsos It is certified that error appears in the above-identified patent and that said Letters Patent is hereby corrected as shown below:

| | | |
|---|---|---|
| Column 20, Line 61; | Delete "- j"; | Insert in place thereof --=j-- |
| Column 23, Line 7; | Delete "6"; | Insert in place thereof --1-- |
| Column 24, Line 16; | Delete "6"; | Insert in place thereof --1-- |
| Column 27, Line 14; | Delete "6"; | Insert in place thereof --1-- |

Column 34, Lines 51-54; Delete "$D= \sum_{i=0}^{m-1} \sum_{j=1}^{m} 2^{-di} \cdot |n_i + N_i - n_j| \cdot x_{ij}$"

Insert in place thereof -- $\sum_{i=0}^{m-1} x_{ij}=1$, for j=1,2, ..., m;

$\sum_{j=1}^{m} x_{ij}=1$, for i= 0,1,2,..., m-1; and $x_{ij}=0$ for i=j;--

Signed and Sealed this

Sixteenth Day of January, 1996

BRUCE LEHMAN

*Attesting Officer*   Commissioner of Patents and Trademarks